US010111014B2

(12) United States Patent
Schnell et al.

(10) Patent No.: US 10,111,014 B2
(45) Date of Patent: Oct. 23, 2018

(54) MULTI-SOURCE AUDIO AMPLIFICATION AND EAR PROTECTION DEVICES

(71) Applicant: Team IP Holdings, LLC, Grand Prairie, TX (US)

(72) Inventors: Timothy D. Schnell, Rancho Santa Fe, CA (US); Doug Mann, Carlsbad, CA (US)

(73) Assignee: Team IP Holdings, LLC, Grand Prairie, TX (US)

( * ) Notice: Subject to any disclaimer, the term of this patent is extended or adjusted under 35 U.S.C. 154(b) by 0 days.

(21) Appl. No.: 15/212,129

(22) Filed: Jul. 15, 2016

(65) Prior Publication Data

US 2017/0048609 A1 Feb. 16, 2017

Related U.S. Application Data

(60) Provisional application No. 62/203,320, filed on Aug. 15, 2015, provisional application No. 62/274,644, (Continued)

(51) Int. Cl.

*H04R 1/10* (2006.01)
*H04R 25/00* (2006.01)
*H03G 3/00* (2006.01)

(52) U.S. Cl.

CPC ........... *H04R 25/43* (2013.01); *H04R 1/1083* (2013.01); *H04R 1/1041* (2013.01); *H04R 2420/07* (2013.01); *H04R 2430/01* (2013.01)

(58) Field of Classification Search

CPC .... H04R 5/033; H04R 1/1041; H04R 1/1083; H04R 2201/107; H04R 2420/07;

(Continued)

(56) References Cited

U.S. PATENT DOCUMENTS 5,426,719 A 6/1995 Franks et al.
6,014,345 A 1/2000 Schmadeka (Continued)

FOREIGN PATENT DOCUMENTS

AU 2011/256920 A1 7/2012
CN 101272154 A 9/2008

(Continued)

OTHER PUBLICATIONS

Kickstarter: The Dash—Wireless Smart in Ear Headphones by BRAGI LLC, http://web.archive.org/web/20140214043005/https://www.kickstarter.com/projects/hellobragi/the-dash-wireless-smart-in-ear-headphones, date provided by archive.org is Feb. 14, 2014, as printed on Mar. 18, 2016, in 20 pages.

(Continued)

*Primary Examiner* — Norman Yu
(74) *Attorney, Agent, or Firm* — Knobbe Martens Olson & Bear LLP

(57) ABSTRACT

Apparatus and methods for multi-source audio amplification and ear protection devices are provided herein. In certain configurations, an audio amplification and ear protection device includes at least one microphone that generates an ambient sound signal based on detecting ambient sound, at least one speaker, and an electrical system that controls sound outputted by the at least one speaker based on amplifying the ambient sound signal and a secondary sound source signal. The electrical system receives a first user-controlled volume signal that is operable to control an amount of amplification provided to the ambient sound signal, and a second user-controlled volume signal that is operable to control an amount of amplification provided to the secondary sound source signal.

28 Claims, 13 Drawing Sheets

Related U.S. Application Data filed on Jan. 4, 2016, provisional application No. 62/354,545, filed on Jun. 24, 2016.

(58) Field of Classification Search

CPC ...... H04R 1/10; H04R 1/1008; H04R 1/1016; H04R 1/1066; H04R 2225/021; H04R 2225/025; H04R 2225/55; H04R 2420/01; H04R 2430/01; H04R 2499/11; H04R 25/30; H04R 25/407; H04R 25/552; H04R 25/558; H04R 25/70; H04R 3/00; H04R 3/005; H04R 5/04; G10K 11/1784; G10K 2210/1081; G10K 2210/3035; G10K 2210/3055; G10K 2210/3056; G10K 2210/504; H03G 3/301; H03G 3/32; H04M 1/6016; H04M 1/6058; H04S 1/005; H04S 7/308

USPC ........ 381/309, 311, 71.6, 104, 107, 119, 18, 381/314, 315, 55, 74; 455/41.2, 575.2

See application file for complete search history.

(56) References Cited

U.S. PATENT DOCUMENTS

| | | | | |
|---|---|---|---|---|
| 6,487,296 | B1 * | 11/2002 | Allen | H04H 20/89 381/80 |
| 6,985,594 | B1 * | 1/2006 | Vaudrey | H04R 3/005 381/104 |
| 7,248,705 | B1 | 7/2007 | Mishan | |
| 8,014,553 | B2 | 9/2011 | Radivojevic et al. | |
| 8,023,663 | B2 | 9/2011 | Goldberg | |
| 8,229,740 | B2 | 7/2012 | Nordholm et al. | |
| 8,606,572 | B2 | 12/2013 | Zhu et al. | |
| 8,666,102 | B2 | 3/2014 | Bruckhoff et al. | |
| 9,129,291 | B2 | 9/2015 | Goldstein et al. | |
| 9,769,556 | B2 | 9/2017 | Honeycutt | |
| 2004/0120534 | A1 * | 6/2004 | Mills, Jr. | H03G 1/0047 381/96 |
| 2004/0137967 | A1 | 7/2004 | Bodley | |
| 2005/0141730 | A1 | 6/2005 | Murphy | |
| 2006/0286933 | A1 | 12/2006 | Harkins et al. | |
| 2007/0147635 | A1 | 6/2007 | Evert et al. | |
| 2007/0160243 | A1 | 7/2007 | Evert et al. | |
| 2007/0223717 | A1 | 9/2007 | Boersma | |
| 2007/0223720 | A1 | 9/2007 | Goldberg et al. | |
| 2008/0166005 | A1 * | 7/2008 | Terlizzi | H04R 1/083 381/375 |
| 2010/0020978 | A1 * | 1/2010 | Garudadri | H04R 5/04 381/57 |
| 2010/0087218 | A1 | 4/2010 | Hannosh et al. | |
| 2010/0132721 | A1 | 6/2010 | Ivory | |
| 2010/0150383 | A1 * | 6/2010 | Sampat | H04R 1/10 381/311 |
| 2011/0243343 | A1 | 10/2011 | Gauger, Jr. et al. | |
| 2013/0066636 | A1 | 3/2013 | Singhal | |
| 2013/0287219 | A1 | 10/2013 | Hendrix et al. | |
| 2014/0079235 | A1 * | 3/2014 | Lyons | G10K 11/178 381/71.6 |
| 2014/0198926 | A1 | 7/2014 | Killion et al. | |
| 2015/0010158 | A1 | 1/2015 | Broadley et al. | |
| 2015/0043741 | A1 | 2/2015 | Shin | |
| 2015/0071457 | A1 | 3/2015 | Burciu | |
| 2015/0264474 | A1 * | 9/2015 | Seo | H04R 1/1091 381/74 |
| 2015/0280669 | A1 * | 10/2015 | Vilermo | H04R 1/1041 381/107 |
| 2015/0289064 | A1 | 10/2015 | Jensen et al. | |

FOREIGN PATENT DOCUMENTS

| | | | |
|---|---|---|---|
| CN | 203933897 | U | 11/2014 |
| KR | 2011-0012343 | A | 2/2011 |
| KR | 1069946 | B1 | 10/2011 |
| TW | M5044580 | U | 7/2015 |
| WO | WO 2008/122081 | A1 | 10/2008 |
| WO | WO 2010/005045 | A1 | 1/2010 |
| WO | WO 2010/022440 | A1 | 3/2010 |
| WO | WO 2010/057267 | A1 | 5/2010 |
| WO | WO 2011/033136 | A2 | 3/2011 |

OTHER PUBLICATIONS

Bragi, "The Dash" https://web.archive.org/web/20140301211637/http://wvw.bragi.com/, date provided by archive.org is Mar. 1, 2014, as printed on Mar. 18, 2016 in 3 pages.

Bragi, The Dash Users Manual (available at https://fccid.io/document.php?id=2808943) as printed Feb. 8, 2017 in 15 pages.

YouTube Video, "The Dash—Wireless Earphones That AMOST Didn't Suck" Released Apr. 12, 2016. https://www.youtube.com/watch?v=867VK-IxfyU as printed on Nov. 1, 2016, with transcription of video, in 10 pages.

GSM Outdoors, "Electronic Muffs" http://web.archive.org/web/20160430143907/http://www.gsmoutdoors.com/shopping/walkers/electronic-muffs.aspx, date provided by archive.org is Apr. 30, 2016, as printed on Mar. 7, 2017, in 4 pages.

ION Sound Experiences, "Tough Sounds—Hearing Protection Headphones with Bluetooth & Radio" http://www.ionaudio.com/products/details/tough-sounds, as printed on Oct. 19, 2015, in 2 pages.

LG, "LG Tone INFINIM™ Wireless Stereo Headset," Model No. HBS-900, https://web.archve.org/web/20150906125052/http://www.lg.com/us/bluetooth-headsets-headphones/lg-HBS-900-tone-infinim, date provided by archive.org is Sep. 6, 2015, as printed on Sep. 6, 2015, in 10 pages.

Amazon, "Bluetooth Headsets" http://web.archive.org/web/20160505082418/http://www.amazon.com/bluetooth-headsets/b?ie=UTF8&node=2407776011, date provided by archive.org is May 5, 2016, as printed on Mar. 7, 2017, in 6 pages.

Amazon, "TaoTronics Bluetooth Headphones, TaoTronics Bluetooth 4.1 Wireless Headphones Stereo Sports Earbuds—Sweatproof In-Ear Headsets (aptX, CVC 6.0 Noise-Cancelling)" http://web.archive.org/web/20161101201010/https://www.amazon.com/Bluetooth-Headphones-TaoTronics-Wireless-Earbuds/dp/B01A6PGZ70/ref=sr_1_73?s=wireless&ie=UTF8&gid=1463604821&sr=1-73, date provided by archive.org is Nov. 1, 2016, as printed on Nov. 1, 2016, in 10 pages.

Amazon, "Plantronics Voyager Legend UC B235-M Bluetooth Headset—Retail Packaging—Black" http://web.archive.org/web/20161101201338/https://www.amazon.com/Plantronics-Voyager-Legend-Bluetooth-Headset/dp/B009ZJ3MSY/ref=sr_1_242?s=wireless&ie=UTF8&qid=1463605041&sr=1-242, date provided by archive.org is Nov. 1, 2016, as printed on Nov. 1, 2016, in 8 pages.

Amazon, "Eaglewood(TM) Small Wireless Bluetooth 4.0 Invisible Earphone Headset Earbud Support Hands-free Calling for iPhone Samsung Sony HTC LG Blackberry and Most Smartphones (Coffee)" http://web.archive.org/web/20161101201540/https://www.amazon.com/Eaglewood-Bluetooth-Hands-free-Blackberry-Smartphones/dp/B017ELS4CS/ref=sr_1_256?s=wireless&ie=UTF8&qid=1463605086&sr=1-256, date provided by archive.org is Nov. 1, 2016, as printed on Nov. 1, 2016, in 6 pages.

Amazon, "Pyle Sound 7—Wireless Bluetooth Headphones, Hands-Free Calling with Built-in Microphone, SD Memory Card Reader, FM Radio, Portable Folding Design" http://web.archive.org/web/20170307190523/https://www.amazon.com/Pyle-Sound-Headphones-Hands-Free-Built/dp/B0136489PO, date provided by archive.org is Mar. 7, 2017, as printed on Mar. 7, 2017 in 6 pages.

Samsung, "Gear IconX Cord-Free Fitness Earbuds" http://www.samsung.com/global/galaxy/gear-iconx/ as printed on Nov. 1, 2016, in 7 pages.

Indiegogo, "Nuheara IQbuds: Super Intelligent Wireless Earbuds," webpage and embedded video, https://www.indegogo.com/projects/nuheara-iqbuds-super-intelligent-wireless-earbuds-headphones#/ as printed Dec. 15, 2016, with transcription of video, in 29 pages.

Nuheara, "IQbuds—Intelligent Truly Wireless Earbuds" http://web.archive.org/web/20161013182207/http://www.nuheara.com/, date provided by archive.org is Oct. 13, 2016, as printed on Mar. 7, 2017, in 8 pages.

(56) References Cited

OTHER PUBLICATIONS

Nuheara News http://www.nuheara.com/latest-wearable-product-news/ as printed Feb. 8, 2017 in 27 pages.
Nuheara IQBuds, ASX Release dated Dec. 21, 2016, in 2 pages.
International Search Report and Written Opinion of the International Searching Authority dated Oct. 21, 2016 for International Application No. PCT/US2016/043386 filed Jul. 21, 2016 in 12 pages.
Casali et al., "A field investigation of hearing protection and hearing enhancement in one device: For soldiers whose ears and lives depend upon it," Noise Health 2009; dated May 22, 2018, in 24 pages, Available from: http://www.noiseandhealth.org/text.asp?2009/11/42/69/48564.
Firecom, Wireless Headset Series, UHW-Series Under the Helmet, FHW-Series Over the Head, Operation Manual, Printed May 22, 2018, in 12 pages.

* cited by examiner

MULTI-SOURCE AUDIO AMPLIFICATION AND EAR PROTECTION DEVICES

CROSS-REFERENCE TO RELATED APPLICATIONS

This application claims the benefit of priority under 35 U.S.C. § 119(e) of U.S. Provisional Patent Application No. 62/354,545, filed Jun. 24, 2016, and titled "MULTI-SOURCE AUDIO AMPLIFICATION AND EAR PROTECTION DEVICES," and of U.S. Provisional Patent Application No. 62/274,644, filed Jan. 4, 2016, and titled "MULTI-SOURCE EAR PROTECTION HEADSET," and of U.S. Provisional Patent Application No. 62/203,320, filed Aug. 10, 2015, and titled "MULTI-SOURCE EAR PROTECTION HEADSET," each of which are herein incorporated by reference in their entireties.

BACKGROUND

Field

The described technology generally relates to audio amplification and ear protection devices.

Description of the Related Technology

Audio amplification and ear protection devices can be used for a variety of purposes. For example, an audio headset can assist in hearing by amplifying sound from a single audio source, thereby allowing the user to listen to the audio source at a desired volume level. Headsets can also be used to protect a user's ears from damage in loud environments.

SUMMARY

In one aspect, an audio amplification and ear protection device comprises at least one microphone configured to generate an ambient sound signal based on detecting ambient sound. The device also includes at least one speaker and an electrical system configured to amplify the ambient sound signal and a secondary sound source signal. The electrical system can be further configured to control the at least one speaker to simultaneously output sound based on the ambient sound signal and sound based on the secondary sound source signal. The electrical system can be further configured to receive a first user-controlled volume signal operable to control an amount of amplification provided to the ambient sound signal and a second user-controlled volume signal operable to control an amount of amplification provided to the secondary sound source signal.

The audio amplification and ear protection device can be a hearing aid, for example.

The device can include a transceiver configured to wirelessly receive the secondary sound source signal. The transceiver can comprise a Bluetooth transceiver, for example. In some implementations, the electrical system is configured to wirelessly receive the first and second user-controlled volume signals.

The audio amplification and ear protection device can also include an audio input port configured to receive the secondary sound source signal via a wired connection. The device can in some embodiments include a built-in audio component configured to generate the secondary sound source signal.

In some implementations, the device further comprises an ambient sound control interface configured to generate the first user-controlled volume signal based on input from a user, and a secondary sound source control interface configured to generate the second user-controlled volume signal based on input from the user. At least one of the ambient sound control interface or the secondary sound control interface can comprise a touch differentiated control. According to certain embodiments, the touch differential control comprises a first knob of a first diameter, and a second knob of a second diameter greater than the first diameter.

The at least one microphone can include a first microphone operable to capture ambient sound from a first direction, and a second microphone configured to capture ambient sound from a second direction different from the first direction. The electrical system can be configured to control sound outputted to a first speaker of the at least one speaker based on ambient sound captured by the first microphone and to separately control sound outputted to a second speaker of the at least one speaker based on ambient sound captured by the second microphone. The electrical system can also be configured to receive one or more user-controlled volume signals operable to separately control volume of sound outputted to the first speaker relative to volume of sound outputted to the second speaker. The device can further comprise a first ear piece including the first speaker and the first microphone, and a second ear piece comprising the second speaker and the second microphone. The device can comprise a device body, wherein the at least one microphone further comprises a third microphone operable to capture ambient sound from a third direction different from the first direction and the second direction, wherein the third microphone is located on the device body. The electrical system can comprise a transceiver configured to wirelessly receive the secondary sound source signal and to wirelessly transmit ambient sound detected by the third microphone. The device body in some such embodiments comprises a first arm, a second arm, and a neck loop connecting the first and second arms, wherein the third microphone is integrated within a perforated acoustic grating of the first arm or the second arm. In some implementations, the first ear piece comprises a first ear plug configured for insertion in a first ear of a user, and the second ear piece comprises a second ear plug configured for insertion in a second ear of a user. The first ear piece can comprise a first ear cup configured to enclose a first ear of a user, and the second ear piece can comprise a second ear cup configured to enclose a second ear of a user.

The electrical system can include an automatic gain controller configured to limit a maximum volume of sound outputted by the at least one speaker. The electrical system can operate in a compression mode for a duration time after detecting an ambient sound event above a threshold, wherein the electrical system is configured to decrease the amount of amplification provided to the ambient sound signal without user input in the compression mode.

The electrical system can be operable in a plurality of user-selectable operating modes, wherein the electrical system is configured to process at least one of the ambient sound signal or the secondary sound source signal differently in each of the user-selectable operating modes. The electrical system can provide frequency-dependent amplification to at least one of the ambient sound signal or the secondary sound source signal in one or more of the plurality of user-selectable operating modes.

According to another aspect, a method of processing sound in an audio amplification and ear protection device is provided. The method can include generating an ambient sound signal based on detecting ambient sound using at least one microphone. The method can further include using one or more speakers to simultaneously output sound based on the ambient sound signal and sound based on a secondary sound signal. The method can additionally include receiving a first user-controlled volume signal as an input to the electrical system; controlling an amount of amplification to the ambient sound signal provided by an electrical system based on the first user-controlled volume signal. The method can also include receiving a second user-controlled volume signal as an input to the electrical system. The method can include controlling an amount of amplification to the secondary sound source signal provided by the electrical system based on the second user-controlled volume signal.

According to yet another aspect an apparatus comprises a first ear piece. The first ear piece can comprise a first microphone configured to generate an ambient sound signal based on detecting ambient sound. The ear piece can also comprise a first speaker configured to output sound based on both the ambient sound signal and a secondary sound source signal. The apparatus can also include electronic circuitry configured to simultaneously amplify the ambient sound signal and the secondary sound source signal. The electronic circuitry can be configured to receive a first user-controlled volume signal operable to control an amount of amplification provided to the ambient sound signal and a second user-controlled volume signal operable to control an amount of amplification provided to the secondary sound source signal.

BRIEF DESCRIPTION OF THE DRAWINGS

Example implementations disclosed herein are illustrated in the accompanying schematic drawings, which are for illustrative purposes only.

DETAILED DESCRIPTION OF EMBODIMENTS

Figure 1A:
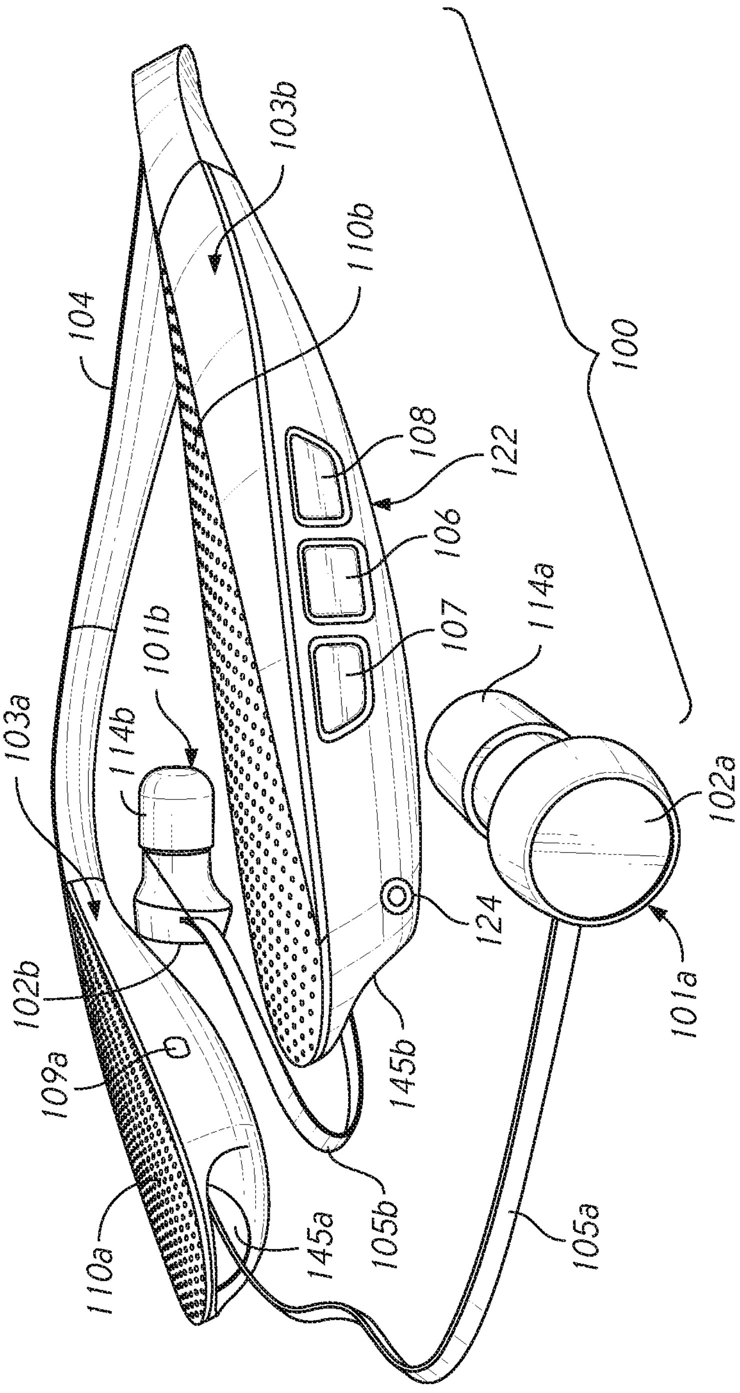
FIG. 1A is a right perspective view of a multi-source audio amplification and ear protection device according to one embodiment.

The following detailed description is directed to certain implementations for the purposes of describing the innovative aspects. However, the teachings herein can be applied in a multitude of different ways. As will be apparent from the following description, a multi-source audio amplification and ear protection device can be implemented in a wide variety of form factors (e.g., in-ear buds or over-ear cups/muffs) and can include a wide range of features and functionality.

There is a need for a multi-source audio amplification and ear protection device that allows a user to hear an ambient sound source captured via microphone(s) while also hearing sounds from a secondary audio source, such as audio received from a wireless connection (for example, Bluetooth), a wired connection (for example, an audio input port), and/or a built-in audio component (for instance, a music player). Additionally, there is a need for a multi-source audio amplification and ear protection device that allows the volume of sounds from the ambient sound source and from the secondary sound source to be separately controlled.

Apparatus and methods for multi-source audio amplification and ear protection devices are provided herein. In certain configurations, a multi-source audio amplification and ear protection device includes at least one microphone that captures ambient sound from an ambient audio source. Additionally, the multi-source audio amplification and ear protection device receives sounds from a secondary audio source via a wireless connection, a wired connection, and/or a built-in audio component. The multi-source audio amplification and ear protection device includes one or more speakers for simultaneously outputting sounds from the ambient sound source and sounds from the secondary sound source, and electronic circuitry that provides separate control over the amplification of sounds from the ambient audio source relative to sounds from the secondary audio source. Implementing the multi-source audio amplification and ear protection device in this manner allows a user to separately control the volume of sounds received from the ambient sound source relative to sounds from the secondary sound source.

In addition to including an electrical system that provides amplification to assist the user in listening to ambient sounds and sounds from the secondary sound source at desired volume levels, the multi-source audio amplification and ear protection device can also protect the user's ears from damage by limiting the volume of loud sounds. For instance, the device can be implemented to provide attenuation or compression of sounds of large amplitude, and thus, also serves as an ear protection device.

The secondary sound source can correspond to a wide variety of sound sources. For example, the secondary sound source can correspond to audio received over a wireless connection, such as a Bluetooth, Zigbee, Wi-Fi, NFMI, AirPlay, SKAA, 2.4 GHz RF, and/or other connection. In another example, the secondary sound source can correspond to audio received over a wired connection, including, for example, sound received via an audio input port. In yet another example, the secondary sound source can correspond to audio received from a built-in audio component, such as a music player, an integrated radio (for instance, AM, FM and/or XM radio), integrated phone and/or audio playback device for playing music, audiobooks, audio courses, and/or other audio content.

Providing a user control over a volume of ambient sound relative to sound from a secondary audio source allows the user to perform a wide variety of tasks and activities while maintaining the user engaged with the world and the user's surroundings. The multi-source audio amplification and ear protection devices disclosed herein can be used in a wide variety of applications, and can be used to enhance a user's listening enjoyment, comfort, convenience, and/or safety.

In one example, a student can listen to instructional audio content, such as a streamed audio course, in a classroom. Additionally, a teacher may provide commentary while the student is listening to the instructional audio content. The student may use the device to control a relative volume of the instructional audio content relative to the volume of the instructor's voice. Thus, the student may be able to simultaneously listen to the audio course content and instructor commentary, and can separately control the volume of each sound source relative to one another.

In another example, a multi-source audio amplification and ear protection device serves as a listening assistance product for a television, computer, and/or other electronic device. The multi-source listening assistance product allows a user to control volume of received sound from the electronic device relative to the volume of ambient sounds. Thus, a user who is hard of hearing (for instance, an elderly person) may listen to the television, computer, and/or other electronic device at an appropriate volume level while remaining engaged with the user's surroundings. For example, if a smoke detector were activated while the user was wearing the multi-source listening assistance product, the user would be able to hear the smoke detector's alarm.

In another example, a child or other person is using the multi-source audio amplification and ear protection device as headphones for an electronic entertainment system, such as a tablet, video game system, computer, laptop, or other electronic device. In addition to hearing sound received from the electronic entertainment system, the user also hears ambient sounds. Thus, the user may hear a voice of a parent, sibling, friend, or other person even when sounds are playing from the electronic entertainment system.

In another example, a passenger of a vehicle, such as an airplane, a train, or a bus, may use the multi-source audio amplification and ear protection device to listen to audio content provided on the vehicle via a wireless network and/or via an audio input port. Additionally, the passenger may listen to the audio content at a desired volume level while remaining engaged with the passenger's surroundings. Thus, the passenger can hear a pilot, a driver, an attendant, and/or requests from other passengers without need to take off or remove the device.

In another example, a visitor to a museum or landmark can listen to an audio guide via the multi-source audio amplification and ear protection device. Additionally, the visitor can also hear the voices of proctors and/or commentary from other visitors, and provide relative control of the volume of the audio guide relative to the volume of ambient sounds.

In another example, a multi-source audio amplification and ear protection device may be used as hearing protection while the user is hunting or shooting. The microphone(s) of the multi-source earmuffs capture ambient sounds, which are provided to the user with attenuation or compression of loud noises, such as gunshots. Thus, the user enjoys the benefits of ear protection while still hearing the sounds of surrounding nature and/or of people's voices, including safety warnings. The user can also control the volume of ambient sounds relative to sounds from a secondary audio source, such as sound associated with a received phone call and/or streamed music. Thus, the user can take phone calls without needing to take off the device, which can be dangerous and/or result in missed calls.

In certain implementations, an electrical system of a multi-source audio amplification and ear protection device includes variable gain amplification circuitry that operates with automatic gain control (AGC) to reduce the volume of ambient sounds after a loud event has been detected. In one example, after detecting a high volume ambient sound event, such as a gunshot, the device can operate with audio compression for a certain amount of time. Implementing the device in this manner helps attenuate the loudness of echoes of an initial loud event and/or other loud events occurring within a certain time frame thereafter. For instance, the user may be in a hunting party and the compression mode can be triggered after an initial gunshot is fired toward a discovered prey. Without requiring the user to manually control the volume, automatic gain control can decrease the volume of echoes of the initial gunshot, as well as to decrease the loudness of subsequent gunshots fired at the discovered prey from the user and/or other members of the hunting party. Although an example of a gunshot is provided, automatic gain control can provide gain compression to a wide variety of loud noises, including, for instance, crashing steel, passing race cars or motorcycles, etc.

In certain implementations, the multi-source audio amplification and ear protection device can provide frequency dependent amplification to ambient sound, thereby providing different amounts of amplification to certain frequencies relative to other frequencies. For instance, the device can provide different amounts of gain to sounds in different frequency ranges, such as a high frequency range relative to a low frequency range. In one example, a user of the device can be bird watching and desire a relatively high amount of amplification to ambient sounds at relatively high frequencies associated with bird chirps or songs.

In certain configurations, a multi-source audio amplification and ear protection device can be operable in a selected mode chosen from multiple user-selectable operating modes or profiles. Additionally, the different user-selectable operating modes can provide different amounts of amplification to sounds of different frequencies and/or provide other mode-dependent processing.

For instance, the multiple user-selectable operating modes can include, but are not limited to, one or more of an indoor human voice mode, an outdoor human voice mode, a hunting mode, an indoor shooting mode, an outdoor shooting mode, a bird watching mode, a car mode, a bus mode, a train mode, an aircraft mode, a restaurant mode, a construction site mode, a sporting boat mode, a classroom mode, an audio guide mode, a media assisted listening mode, a loud concert mode, and/or a headphones mode. In one embodiment, the user can store one or more user modes or profiles, which can be, for example, custom modes developed by the user and/or modified versions of one or more preset modes. In certain implementations, a user may download one or more modes made available via the internet.

Each user-selectable operating mode can provide amplification, equalization, and/or other audio processing suitable for a particular application or operating environment associated with the mode. The sound volume after such processing can be further scaled by the user via volume control, including separate volume control for both the ambient sound source and the secondary sound source.

In one example, a sporting boat mode can provide a relatively large amount of attenuation to low frequency sounds associated with boat motors, while providing a relatively large amount of amplification to frequencies associated with human voice. Thus, a user of the device can hear a boat engine at a reduced or attenuated volume, while hearing human voices (including, for instance, voices of passengers/observers, vehicle operators, and/or towed persons) at a relatively louder volume. In another example, a user of the multi-source audio amplification and protection device may be bird watching and desire a greater amount of amplification to high frequency ambient sounds relative to low frequency ambient sounds. In yet another example, an indoor human voice mode can include processing to amplify human voice, while providing audio processing to compensate for voice echoes and/or to attenuate background noise.

In one embodiment, a multi-source audio amplification and ear protection device includes a hearing aid semantic. Thus, a user may get his or her hearing tested, and the multi-source audio amplification device can operate with user-customizable data to compensate for a hearing loss profile of the user. For example, the user-customizable data can be used to provide equalization to compensate for hearing loss or sensitivity to particular audio frequencies.

In certain implementations, an audio device includes multiple microphones, including, for instance, one or more directional microphones. In one embodiment, ambient sounds captured from the microphones can be processed differently based on the operating mode. For instance, in a human voice mode, a relatively large amount of amplification can be provided to sound captured from a directional microphone pointed generally in front of a user, thereby helping the user to better hear voice in the direction that the user is facing.

The multi-source audio amplification and ear protection devices herein can be controlled by a user in a wide variety of ways. In certain implementations, a user may control the device using one or more user interfaces on the device, including but not limited to, buttons, switches, knobs, levers, touch screens, and/or other controls. In certain implementations, the device includes one or more tactile controls that a user can distinguish by touch, thereby aiding the user in controlling the device without needing to look at an interface. Additionally, the devices herein can be remotely controlled including, for example, by a dedicated remote control and/or by using a tablet, phone, smart watch, laptop, computer, and/or other control device. Moreover, the teachings herein are applicable to voice-activated controls.

In certain implementations, a multi-source audio amplification and ear protection device is implemented to be waterproof. Additionally, to enhance tolerance to water submersion, controls are omitted from the device in favor of controlling the device remotely. Thus, a surfer can use the device to, for instance, listen to music and/or take calls, while still hearing ambient sounds, such as waves and/or the voices of other surfers.

The multi-source audio amplification and ear protection devices herein can be implemented a wide variety of form factors, can include a diverse multitude of features, and can be used in a vast range of applications. Example implementations of a multi-source audio amplification and ear protection device include, but are not limited to, amplification headsets, listening assistance devices, amplification earmuffs, hearing aids, and/or personal sound amplification products (PSAPs).

In certain configurations, an audio amplification and ear protection device includes at least one microphone that generates an ambient sound signal based on detecting ambient sound, at least one speaker, and an electrical system that controls sound outputted by the at least one speaker based on amplifying the ambient sound signal and a secondary sound source signal. The electrical system receives a first user-controlled volume signal that is operable to control an amount of amplification provided to the ambient sound signal, and a second user-controlled volume signal that is operable to control an amount of amplification provided to the secondary sound source signal.

FIGS. 1A-1E illustrate various views of one embodiment of a multi-source audio amplification and ear protection device 100. The multi-source audio amplification and ear protection device 100 includes a first or right retractable ear plug 101*a*, a second or left retractable ear plug 101*b*, a first or right arm 103*a*, a second or left arm 103*b*, a neck loop 104, a first or right ear plug cable 105*a*, a second or left ear plug cable 105*b*, an ambient sound control interface 121, and a secondary audio source control interface 122.

Although FIGS. 1A-1E show one embodiment of an audio amplification and ear protection device that can provide a user with separate control of multiple audio sources, the teachings herein are applicable to a wide variety of configurations. For example, the teachings herein are applicable to audio amplification and ear protection devices implemented using a wide variety of form factors and/or including a wide range of features or functionality.

In the illustrated embodiment, the ambient sound control interface 121 provides a user of the device with control over the volume of ambient sound. The ambient sound source is captured via one or more microphones of the device 100, as will be described in detail further below. Additionally, the secondary sound source control interface 122 provides a user of the device 100 with control over the volume of sound from a secondary sound source, which can be, for example, audio received over a wireless connection (for instance, a Bluetooth, Zigbee, Wi-Fi, NFMI, AirPlay, SKAA, 2.4 GHz RF, and/or other connection), audio received over a wired connection (for instance, via an audio input port 124), and/or audio received from a built-in audio component, such as a music player, an integrated radio (for instance, AM, FM and/or XM radio), integrated phone and/or audio playback device.

In the illustrated embodiment, the ambient sound control interface 121 includes buttons 111-112 and the secondary sound source control interface 122 includes buttons 106-108. Although the illustrated embodiment uses button interfaces implemented on the device 100, the teachings herein are applicable to devices controlled in a wide variety of ways. For example, an ambient sound control interface and/or a secondary sound source control interface can use a different style of interface and/or can be located in other positions. Additionally, the teachings herein are applicable to devices that are remotely controlled, including but not limited, devices controlled using a dedicated remote control (wireless and/or wired, such as a pluggable) and/or by using a tablet, phone, smart watch, laptop, computer, and/or other control device. Moreover, the teachings herein are applicable to devices that operate using voice-activated control. Furthermore, the teachings herein are applicable to devices that can be controlled in multiple ways, such by a combination of on-device interface(s), remote control device(s), and voice-activated control(s), thereby providing the user with flexibility in controlling the device in a manner that is desirable for a particular application.

In the illustrated embodiment, the device 100 includes a device body comprising the right arm 103*a*, the left arm 103*b*, and the neck loop 104. However, an audio amplification and ear protection device can include a device body implemented in a wide variety of ways. Moreover, in certain implementations, an audio amplification and ear protection device omits a device body.

With continuing reference to FIGS. 1A-1E, the right arm 103*a* is coupled to the left arm 103*b* via the neck loop 104 in this embodiment. Additionally, the right arm 103*a* includes the ambient sound control interface 121, a perforated acoustic grating or mesh 110*a*, and a right ear plug retraction control button 109*a*. Furthermore, the left arm 103*b* includes the secondary sound source control interface 122, a perforated acoustic grating or mesh 110*b*, a left ear plug retraction control button 109*b*, and an audio input jack 124. Additionally, the right arm 103*a* is coupled to the right retractable ear plug 101*a* via the right ear plug cable 105*a*, and the left arm 103*b* is coupled to the left retractable ear plug 101*b* via the left ear plug cable 105*b*.

Although FIGS. 1A-1E show a specific device implementation, an audio amplification and ear protection device can be implemented in a wide variety of ways. Thus, the device 100 can be modified and/or adapted in a wide variety of ways, and can include a wide variety of form factors and/or include a wide range of features or functionality. Additionally, although shown as including ear plugs, an audio amplification and ear protection device can include a wide range of ear piece(s), including, for example, ear plug(s), ear cup(s), ear phone(s), or a combination thereof.

In the illustrated embodiment, the perforated acoustic grating 110*a* extends along a top surface of the right arm 103*a*. In certain implementations, the perforated acoustic grating 110*a* includes at least one of a microphone or a speaker therein. For example, as will be discussed further below, FIG. 1C illustrates a cross-section of one implementation of the right arm 103*a* that includes a microphone. The perforated acoustic grating 110*b* extends along a top surface of the left arm 103*b*, and in certain implementations can include at least one of a microphone or a speaker therein. In one embodiment, one of the arms includes a microphone and the other arm includes a speaker.

As shown in FIG. 1A, the right arm 103*a* includes a cavity 145*a* implemented to receive the right retractable ear plug 101*a* and the right ear plug cable 105*a*. By selectively pressing the right ear plug retraction control button 109*a*, a user of the device 100 may retract or extend the right retractable ear plug 101*a*. For example, in one implementation, pressing the right ear plug retraction control button 109*a* reels in right retractable ear plug 101*a*, while the user can extend the right retractable ear plug 101*a* by manually pulling on the right retractable ear plug 101*a*. Similarly, the left arm 103*b* includes a cavity 145*b* implemented to receive the left retractable ear plug 101*b* and the left ear plug cable 105*b*, and the left ear plug retraction control button 109*b* can be used to control retraction of the left retractable ear plug 101*b*.

Figure 1B:
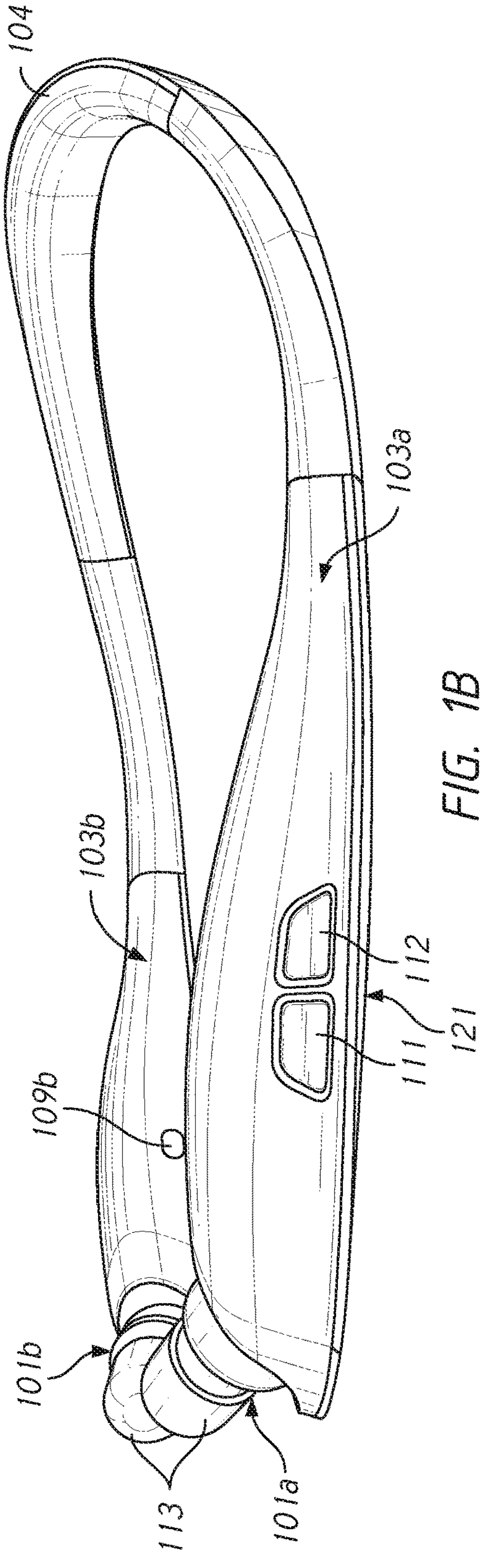
FIG. 1B is a left perspective view of the multi-source audio amplification and ear protection device of FIG. 1A.
Figure 1C:
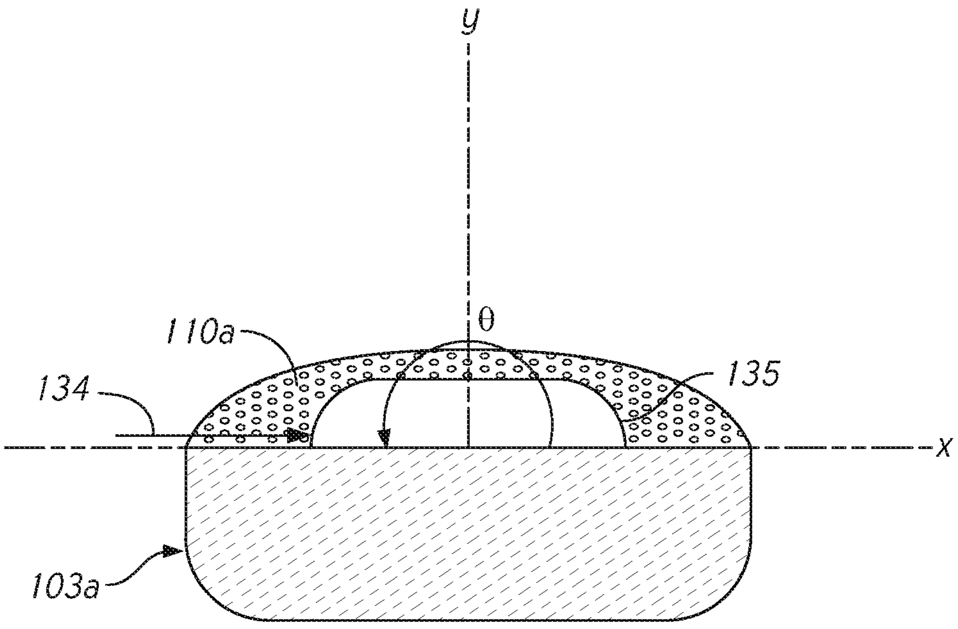
FIG. 1C is a cross-section of an arm of the multi-source audio amplification and ear protection device of FIG. 1A.
Figure 1D:
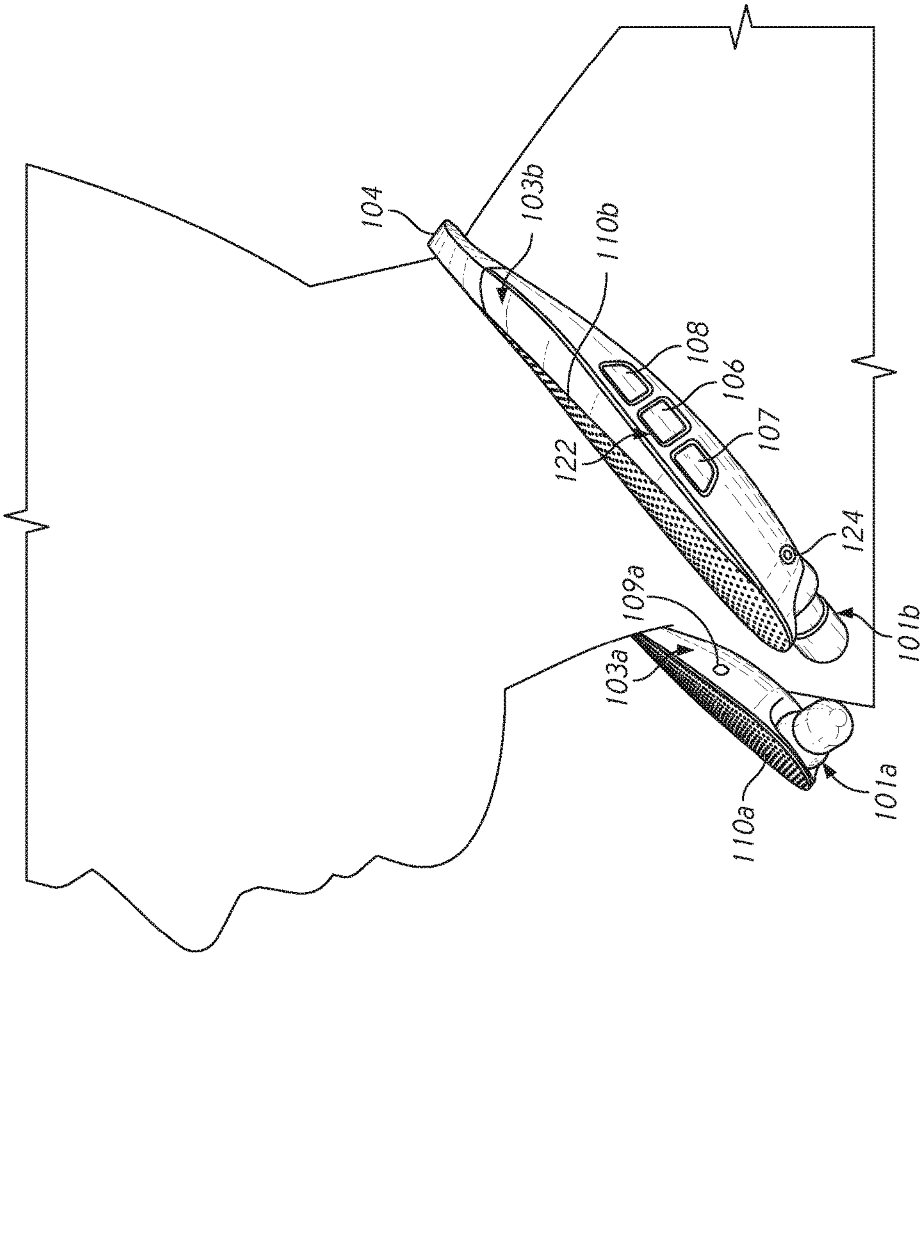
FIG. 1D is a perspective view of one example of a user wearing the multi-source audio amplification and ear protection device of FIG. 1A.
Figure 1E:
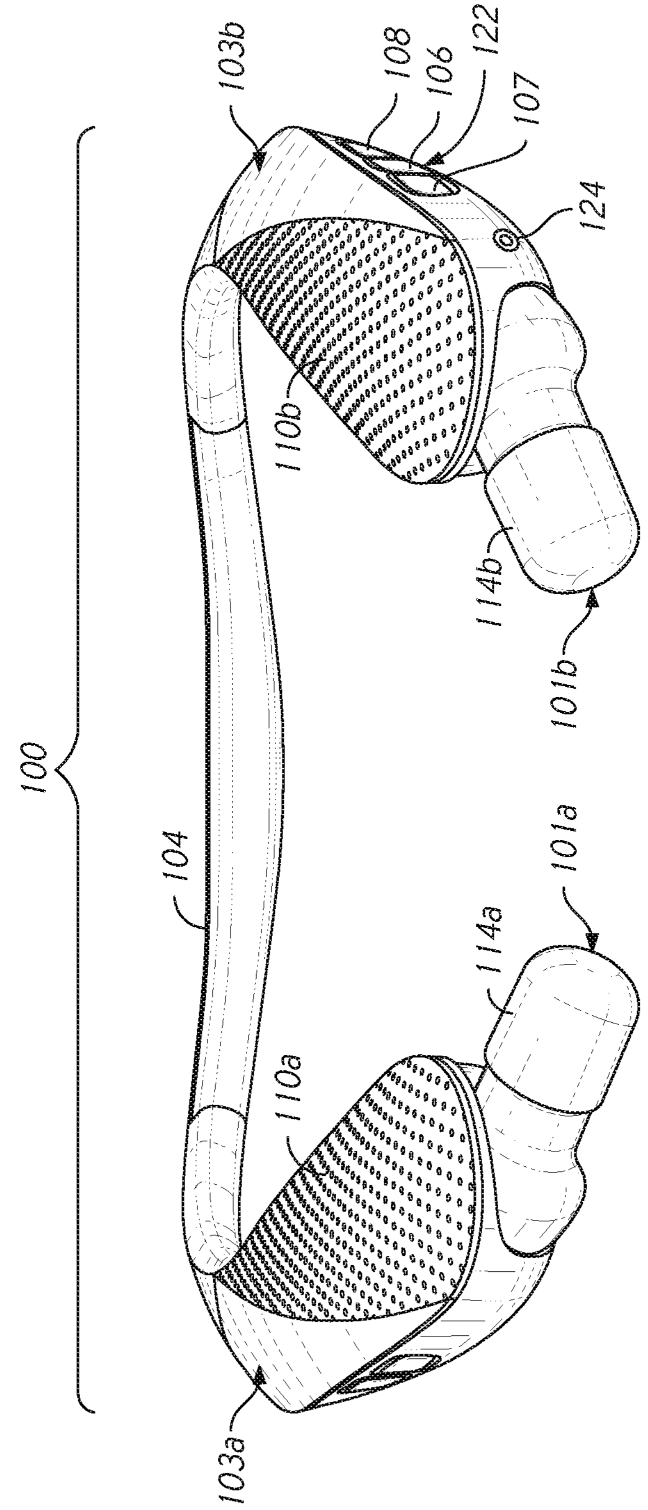
FIG. 1E is a front perspective view of the multi-source audio amplification and ear protection device of FIG. 1A.

The right and left retractable ear plugs 101*a* and 101*b* are shown in an extended position in FIG. 1A, and in a retracted position 113 in FIGS. 1B, 1D, and 1E. Although one implementation of retractable/extendable ear plugs is shown, other configurations are possible. Moreover, the teachings herein are applicable to implementations in which ear pieces do not retract or extend.

As shown in FIG. 1D, the device 100 can be worn around the neck of a user. Additionally, the right and left retractable ear plugs 101*a*, 101*b* can be placed in the user's ears to provide audio amplification and ear protection. The device 100 of FIGS. 1A-1E illustrates one embodiment of a multi-source audio amplification and ear protection device that is implemented using a wrap-around-the-neck form factor and in-ear/insertable plugs, which can be, for example, all-purpose or custom to a user. However, other form factors are possible, and a multi-source audio amplification and ear protection device need not include in-ear plugs. For example, to provide a greater amount of hearing protection, a multi-source audio amplification and ear protection device can be implemented using earmuffs rather than ear plugs.

As persons having ordinary skill in the art will appreciate, the ear plugs are referred to as a right retractable ear plug 101*a* and a left retractable ear plug 101*b* for reference purposes, and wearing the device 100 with right and left retractable ear plugs 101*a*, 101*b* in a user's right and left ears, respectively, can allow for more ergonomic adjustment of the volume controls among other possible benefits. However, it will be understood a user can wear the device 100 with the right retractable ear plug 101*a* in the user's left ear and/or with the left retractable ear plug 101*b* in the user's right ear. Furthermore, the neck loop 104 can be worn in a variety of ways, including with the inside of the loop closest to the back of the user's neck or with the inside of the loop closest to the front of the user's neck. Moreover, the neck loop 104 can be held in the user's hand or used in a wide variety of other ways, including, for instance, on top of a hat and/or head.

In the illustrated embodiment, the right retractable ear plug 101*a* includes a right ear microphone 102*a* and a right ear speaker 114*a*. Additionally, the left retractable ear plug 101*b* includes a left ear microphone 102*b* and a left ear speaker 114*b*.

The multi-source audio amplification and ear protection device 100 includes microphones, such as the right ear microphone 102*a* and the left ear microphone 102*b*, for capturing ambient sounds. Although one implementation of microphones is shown, the device 100 can include more or fewer microphones and/or microphones arranged in other ways. For example, in one embodiment, the right and/or left perforated acoustic gratings 110*a* and 110*b* include(s) a microphone. The device's microphone(s) can be implemented in a wide variety of ways, and can include, for example, one or more condenser, dynamic, carbon, and/or piezoelectric microphones.

The right ear speaker 114*a*, the left ear speaker 114*b*, and/or speaker(s) in the perforated acoustic gratings provide amplified sound and/or sound of enhanced quality to a user. The sound provided to the user can simultaneously include both ambient sound and sound from a secondary sound source. Additionally, the volume of ambient sound can be separately controlled relative to the volume of sound from the secondary sound source.

In certain implementations, the processing of sound using the right ear microphone 102*a* and the right ear speaker 114*a* can be at least partially independent of the processing of sound using the left ear microphone 102*b* and the left ear speaker 114*b*. For example, in one embodiment, when one the right ear microphone 102*a* detects a particular noise in the ambient environment and the left ear microphone 102*b* does not detect that particular noise, an amplified version of the noise can be provided to the right ear speaker 114*a* but not to the left ear speaker 114*b*.

Accordingly, in certain implementations, the multi-source audio amplification and ear protection device 100 can detect ambient sounds using the right and left ear microphones 102*a* and 102*b*, respectively, and amplify and/or otherwise process the detected ambient sounds to drive the right and left ear speakers 114*a* and 114*b*, respectively. Implementing the device 100 in this manner can aid a user to better discriminate the direction from which particular ambient sounds are coming. For instance, if a sound is originating from the right of the user, the corresponding sound reproduced in the right ear speaker 114*a* can have a greater volume than the corresponding sound (if any) reproduced in the left ear speaker 114*b*.

In certain implementations, the device 100 includes one or more microphones in and/or on the right arm 103*a*, the left arm 103*b*, and/or the neck loop 104. Including microphones in this manner can aid in capturing the user's voice, such as when the user is making calls via a Bluetooth connection. Moreover, implementing the microphones in this manner can aid in capturing sound in front of and/or behind the user.

The multi-source audio amplification and ear protection device 100 includes an electrical system, such as electronic circuitry, that can be used to provide amplification and/or other processing to sounds from multiple sound sources, including ambient sounds as well sounds from a secondary sound source. The audio amplification and/or other audio processing can be provided in a wide variety of ways. In one example, the electronic circuitry can include analog amplifiers, such as variable and/or programmable gain amplifiers, used to provide a desired amount of amplification. In another example, the amplification is achieved at least in part by using digital processing. For instance, analog signals captured by the device's microphones can be converted into the digital domain using analog-to-digital converters. Thereafter, the values of the digital signals can be adjusted to provide digital amplification, and thereafter adjusted digital signals can be converted into signals suitable for driving the device's speakers. In addition to amplification, the device's electronic circuitry can also provide equalization, echo suppression or cancellation, compensation for multipath acoustic effects, noise cancellation, wind reduction, and/or other processing.

For example, in one embodiment, the device's electronic circuitry provides at least one of noise management, acoustic feedback control, delay filtering, or customized hearing loss compensation. The noise management can include, for example, spectral subtraction, binaural noise reduction, adaptive noise cancellation, directional microphone processing, impulsive sound suppression, wind noise reduction, automatic volume control, volume control learning, and/or low-level expansion. The customized hearing loss compensation can include, for example, adaptive dynamic range compensation (for instance, linear quasi-time-invariant compression) and/or wide dynamic range compensation (for instance, syllabic sub-band compression).

Thus, the device's electronic circuitry can provide a variety of audio processing functions to enhance listening enjoyment and/or sound quality.

In one example, spectral subtraction is used to reduce gain in frequency sub-bands in which strength of desired signals is relatively small. In another example, binaural noise reduction is used to process signals associated with both left and right ear devices to separate noise from a desired speech signal. In another example, impulse noise suppression is used to detect sudden loud sounds, and to reduce gain to suppress the noise thereafter. In another example, a sound signal is processed to reduce or remove noise arising from air turbulence at or near a microphone's input diaphragm. In another example, automatic volume control adjusts the loudness of sounds from a speaker relative to an ambient noise level. In another example, volume control learning is used to track use patterns of manual volume control, and the tracked patterns are applied to predict preferred loudness settings. In another example, reduced gain is applied to very low-level input sounds, which can be associated with microphone circuit noise. In another example, acoustic feedback control is used to estimate the acoustic path of a feedback signal from speaker output to microphone input, such that unwanted acoustic feedback is subtracted from the microphone input signal. In another example, low delay filtering provides filtering of an audio signal power spectrum with low acoustic delay to limit an echo effect. In another example, a linear-quasi-time-invariant compression is used to adjust audio frequency response by applying lower gains for high-level inputs relative to low-level inputs across the audio spectrum, with changes to the frequency response being sufficiently slow such that the device operates as a time-invariant linear filter over short time intervals. In another example, wide dynamic range compression is used to adjust frequency response by applying lower gains for high-level inputs than for low-level inputs in each part of the audio spectrum, with changes to the frequency response being sufficiently fast to change gain at the syllabic rate of speech.

The multi-source audio amplification and ear protection device 100 can be used to limit or attenuate loud sounds, thereby protecting a user's ears from damage. For example, the device 100 can be implemented to attenuate or compress audio sounds above a particular threshold, such as loud ambient sounds detected by the device's microphone(s). For instance, if the right ear microphone 102*a* or left ear microphone 102*b* detects sound above a particular threshold level (for instance, 100 dB), the audio electronics of the device 100 can reduce the signal provided to the speaker of the corresponding ear such that the sound heard by the user's ear is within a safe volume level. In certain implementations, the device's threshold level(s) are user-adjustable.

In certain implementations, the multi-source audio amplification and ear protection device 100 is implemented with automatic gain control to reduce the volume of ambient sounds after a loud event has been detected. Implementing the device in this manner helps attenuate the loudness of echoes of an initial loud event and/or other loud events occurring relatively soon thereafter. In certain implementations, the device's time window(s) and/or threshold level(s) for automatic compression are user-adjustable and/or vary with an operating mode or profile of the device.

In one embodiment, the device 100 provides frequency dependent amplification to ambient sound, thereby providing different amounts of amplification to certain frequencies relative to other frequencies. In one embodiment, the device 100 is switchable between different user-selectable operating modes or profiles that can have different frequency-dependent processing, as will be described in further detail below with respect to FIG. 5. In one embodiment, the device 100 includes a hearing aid semantic, and thus can operate with user-customizable data to compensate for a hearing loss profile of the user.

The right arm 103*a* and the left arm 103*b* each have a respective curvature or contour. Additionally, the perforated acoustic grating 110*a* extends along a substantial portion of an upper surface of the right arm 103*a*. For example, in the illustrated embodiment, the perforated speaker grating 110*a* extends across a full width of the right arm 103*a*, and gradually narrows or tapers as the grating 110*a* approaches the neck loop 104. Similarly, the perforated acoustic grating 110*b* extends along a substantial portion of an upper surface of the left arm 103*b* and extends across a full width of the left arm 103*b*.

Implementing the perforated acoustic gratings 110*a* and 110*b* in his manner can increase the sound detection surface area, thereby improving detection of ambient sounds. In one example, the surface area of the grating can be at least about 5 square centimeters ($cm^2$). Other granting surface areas, however, are possible.

The convex, outward curve of the perforated acoustic gratings 110*a* and 110*b* help detect and direct sound waves arriving from multiple directions.

For example, FIG. 1C depicts a cross-sectional width of one implementation of the right arm 103*a*. As shown in FIG. 1C, the right arm 103*a* can include an arm microphone 135 that detect sounds waves over an angle θ of about 180 degrees. For instance, a sound wave 134 arriving generally lateral to the arm 103*a* (parallel to the x-axis) can pass through the perforated acoustic grating 110*a* and reach the arm microphone 135. Additionally, the arm microphone 135 includes a curved surface having outermost surface portions that are able to detect audio generated to the side of the user. Further, the arm microphone 135 includes a tapered top surface portion, such that audio waves coming from the front of and above the user are also received by the arm microphone 135. Thus, the arm microphone 135 can detect sounds waves over an angle θ of about 180 degrees in this example. Other microphone implementations are, however, possible.

The multi-source audio amplification and ear protection device 100 can receive audio from a secondary sound source. The secondary sound source can be, for example, audio received over a wireless connection, audio received over a wired connection, and/or audio received from a built-in audio component. In certain implementations, the audio from the secondary sound source is provided to the right ear speaker 114*a* and left ear speaker 114*b* in combination with ambient sound captured via the device's microphones. In another implementation, audio from the secondary sound source is provided to or can be selectively provided to one or more other speakers. For example, the left arm 103*a*, the right arm 103*b*, and/or the neck loop 104 can include a speaker used for outputting an amplified version of sound received from the secondary sound source. Implementing a device in this manner allows a user to play music that can be heard by others and/or allows the user to hear music when the ear plugs 101*a* and 101*b* are not inserted in the user's ears. For instance, a user may listen to music while skiing on the slopes with the ear plugs 101*a* and 101*b* removed and retracted.

The multi-source audio amplification and ear protection device 100 can also be implemented to make phone calls using, for instance, a Bluetooth connection. For example, the device 100 can be connected to a mobile phone using Bluetooth, and the mobile phone can transmit audio signals to the user, which the user can hear via the right and left ear speakers 114*a* and 114*b*. Additionally, the user's voice can be detected by the device's microphones, for instance, on the right and left ear microphones 102*a* and 102*b*, and/or one or more microphones in the arms (for the example, the arm microphone 135 of FIG. 1C), and/or the neck loop 104. Additionally, the device 100 can transmit the captured voice signal to the mobile device. Thus, the device 100 can provide two-way audio communication, such that a user can make a phone call via Bluetooth and/or another connection.

In one embodiment, the buttons of the secondary sound source control interface 132 can be used to control a remote device, including but not limited to, a paired device connected via Bluetooth. In one example, the outermost buttons 107, 108 can be used to transmit next track and previous track commands, respectively. In another example, the outermost buttons 107, 108 can be used to control volume of the secondary sound source. In certain implementations, one or more of the buttons 106-108 can be used for multiple functions. For instance, when, for example, the outermost button 107 or button 108 is pressed twice in succession, or when the outermost button 107 or button 108 is pressed in conjunction with the button 106, a different function can be provided. In another example, one or more buttons of the secondary sound source control interface 132 can be used to control a listening mode or profile. In certain configurations, a sequence of button pushes over time and/or a combination of button commands can be used to input data into a secondary sound source control interface.

In certain implementations, the button 106 can provide synchronization or pairing with a device that generates the secondary audio source. In one example, the button 106 serves a pairing button, such as a Bluetooth pairing button, that can be, for instance, pressed and held for at least a certain amount of time (for example, 1 second) to activate pairing. In one example, the device 100 is equipped with a passcode that can be entered into the paired device, and once the passcode is entered and accepted, the pairing can be completed. However, other implementations are possible. For example, a device can be synchronized or paired with another device automatically without user action or via voice-activation, remote control, and/or using other implementations of on-device interfaces. Additionally, the teachings herein are applicable to a wide range of wireless and wired connections in addition to Bluetooth.

The ambient sound control interface 121 and the secondary sound source control interface 122 allow the user to separately control the volume of ambient sound and sound from the secondary sound source. Thus, if a user desires to reduce or eliminate a volume of external or ambient noise relative to music or audio from another source (for instance, a paired device), the user can control relative volume level of the sound sources using the ambient sound control interface 121 and the secondary sound source control interface 122. In certain implementations, the device 100 can further include controls (including, for instance, on-device controls and/or remote controls) for adjusting the volume level of sound provided to each ear. In such implementations, a user can increase the volume of one of the left or right ear relative to the volume provided to the other of the left or right ear. In one embodiment, a volume control for the right ear is located on the right arm 103*a* and a volume control for the left ear is located on the left arm 103*b*. Other implementations, however, are possible.

In certain implementations, electronic circuitry used for generating amplified sound from the secondary sound source is positioned in one of the right arm 103*a* or the left arm 103*b*, and a concealed wire in the neck loop 104 is used to provide the amplified sound to the other arm. For instance, a concealed wire can be embedded within or otherwise extends along the contour of the neck loop 104 into the opposite arm, and routed into the opposite ear plug. In this manner, sound from a paired device can be transmitted to both ear plugs 101*a* and 101*b* even when a Bluetooth chip or other electronic circuitry is included in only one arm of the device. Other configurations, however, are possible. For example, in another embodiment, two or more portions of the device 100 can wirelessly communicate with one another.

The multi-source audio amplification and ear protection device 100 can be constructed using a wide variety of materials. In one example, the neck loop 104 and/or the arms 103*a* and 103*b* can include at least one piece of rubber or plastic. In certain implementations, the ear plugs 101*a* and 101*b* can include a memory foam surrounding the right and left ear speakers 114*a* and 114*b*, thereby aiding in providing sound reduction and/or helping to protect the user's ears from damage from loud sounds. In one example, the memory foam provides about 28 dB or more of sound reduction as compared to when the user is not wearing any hearing protection. However, other amounts of sound reduction are possible. In certain implementations, the memory foam provides aid in customizing the ear plugs 101*a*, 101*b* for use by a particular user, thereby enhancing comfort and/or listening enjoyment.

In one embodiment, when the device 100 is powered on and the volume level for ambient sounds is set to a minimum volume setting using the ambient volume control interface 121, the device 100 drives the right and left ear speakers 114*a* and 114*b* at a sufficient loudness level such that the speakers output a sound level approximately equal to the external sound level detected by microphones 102*a* and 102*b*, respectively. In such an example embodiment, when the device 100 is powered on and the volume level is set to a maximum level using the volume control interfaces 121 and 122, the electrical system within the device 100 drive the speakers within the ear plugs 101*a* and 101*b* such that the speakers output a sound level about 5 times (about +14 dB) higher than the detected exterior sound level, e.g., up to about 66 dB of outside noise. For detected ambient sound levels above 80 dB, the device 100 of the example embodiment compresses the detected sound to be within 80 dB, and delivers the compressed audio to the speakers. Although one example of volume levels has been described, other implementations of volume levels can be used.

The multi-source audio amplification and ear protection device 100 can be powered in a variety of ways. In one embodiment, the device 100 is battery powered, such as by using lithium-based battery technology. In such configurations, the device's battery or batteries can be charged in a variety of ways, such as by using a charging plug and/or by using wireless charging technology, such as inductive charging. The device 100 can also be implemented without batteries, such as implementations in which the device is plugged into a wall outlet for operation and/or receives power via an interface, (for instance, a USB interface). In certain implementations, the multi-source audio amplification and ear protection device 100 operates using replaceable batteries, including, but not limited to, AA or other consumer batteries.

Providing a multi-source audio amplification and ear protection device that can process sound as described herein can increase a user's listening enjoyment, comfort, convenience, and/or safety. Thus, the user may use the device while performing a wide range of activities. In contrast, a user of a single source audio device can frequently remove the headset for various purposes. For example, the user of the single source audio device can remove the device to answer a phone call, to listen to digital music, to hear someone speaking, and/or for a variety of other reasons. However, removing the device can result in loud noise damaging the user's ears, missed communications, and/or the device being lost, left behind or stolen.

Thus, the illustrated device 200 can be worn safely and comfortably, and avoids a need to remove the device in order to simultaneously listen to both ambient sounds and sounds from a secondary sound source.

Figure 1F:
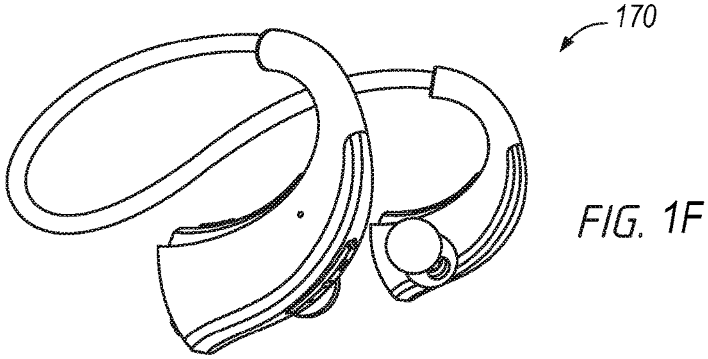
FIG. 1F is a schematic diagram of a multi-source audio amplification and ear protection device according to another embodiment.
Figure 1G:
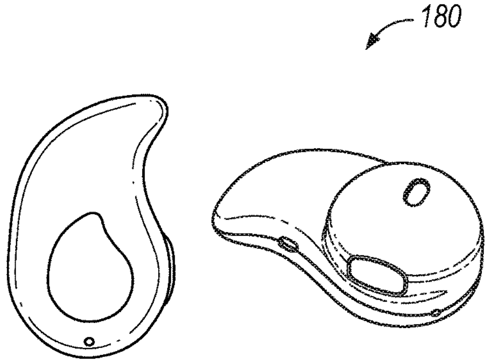
FIG. 1G is a schematic diagram of a multi-source audio amplification and ear protection device according to another embodiment.
Figure 1H:
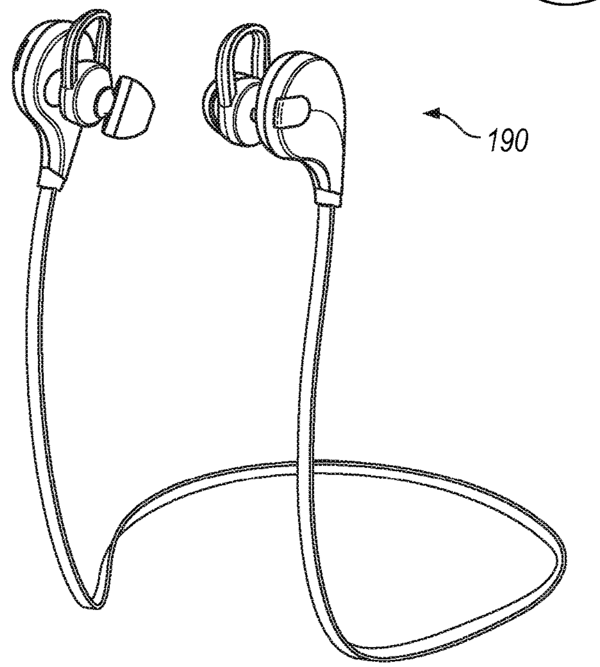
FIG. 1H is a schematic diagram of a multi-source audio amplification and ear protection device according to another embodiment.

FIGS. 1F-1H show schematic diagrams of multi-source audio amplification and ear protection devices according to various embodiments. The multi-source audio amplification and ear protection devices of FIGS. 1F-1H can include any suitable combination of features described herein, and illustrate three example device form factors.

A variety of other form factors are possible. For instance, the multi-source audio amplification and ear protection device 170 of FIG. 1F includes headphones connected via a head strap that can be worn on a user's head. The multi-source audio amplification and ear protection device 180 of FIG. 1G includes ear plugs that can be inserted in a user's ears and that can communicate with one another wirelessly. The multi-source audio amplification and ear protection device 190 of FIG. 1H includes headphones connected via a neck strap, which can aid the user to use the device while participating in sports and/or other mobile activities.

Although FIGS. 1F-1H illustrate three example form factors, a multi-source audio amplification and ear protection device can be implemented in a wide variety of form factors and can include a wide range of features and functionality.

Figure 2A:
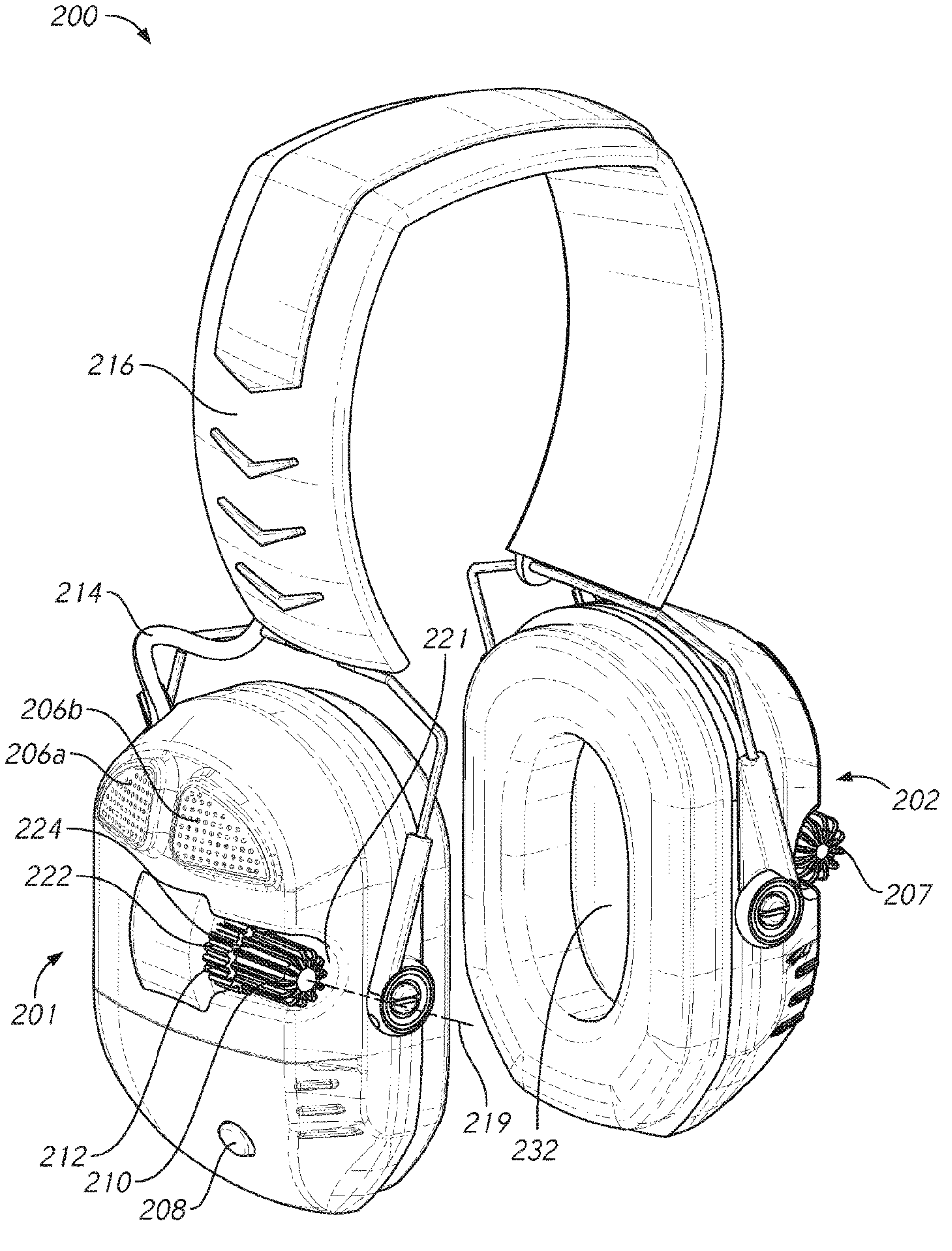
FIG. 2A is a left perspective view of a multi-source audio amplification and ear protection device according to one embodiment.
Figure 2B:
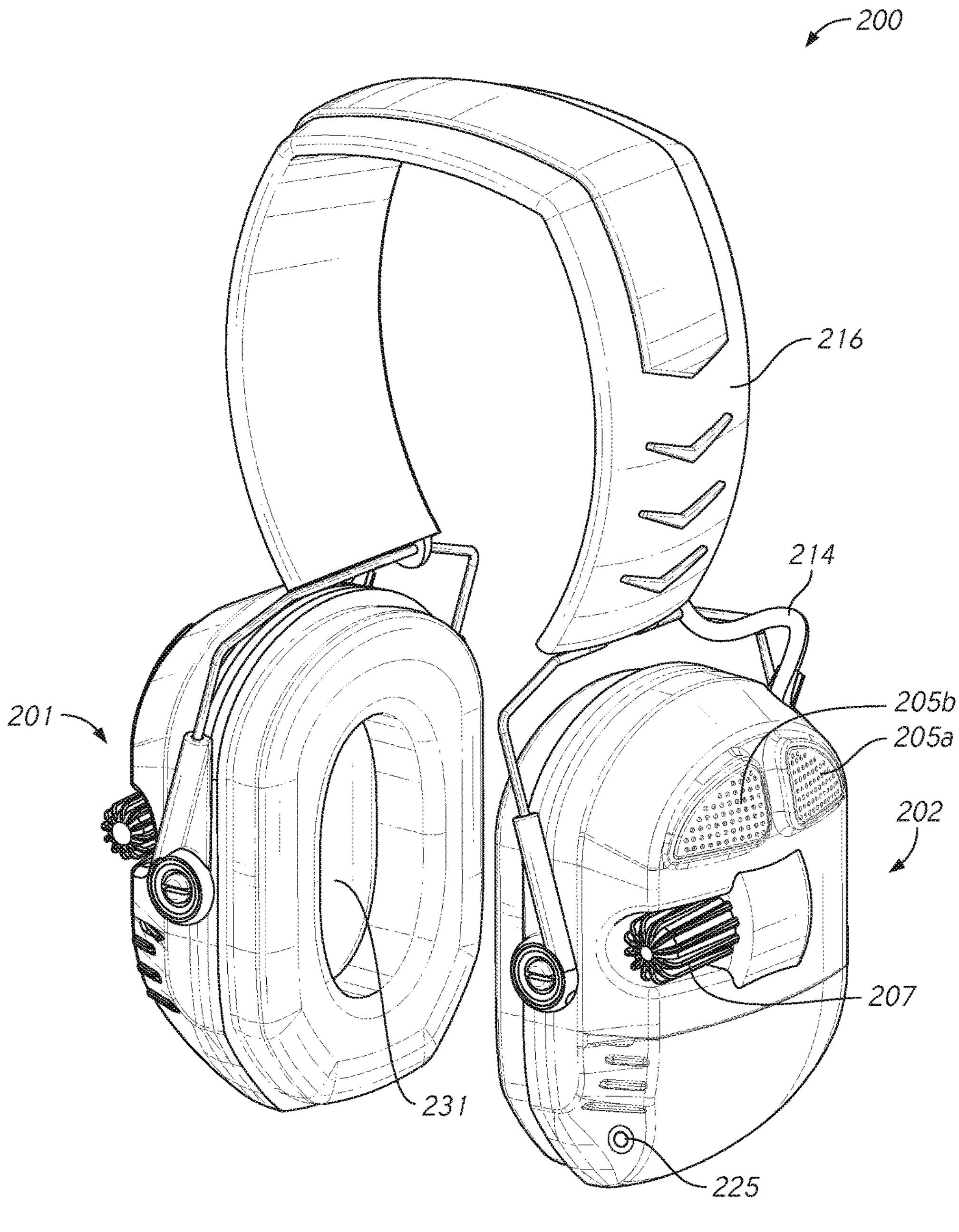
FIG. 2B is a right perspective view of the multi-source audio amplification and ear protection device of FIG. 2A.
Figure 2C:
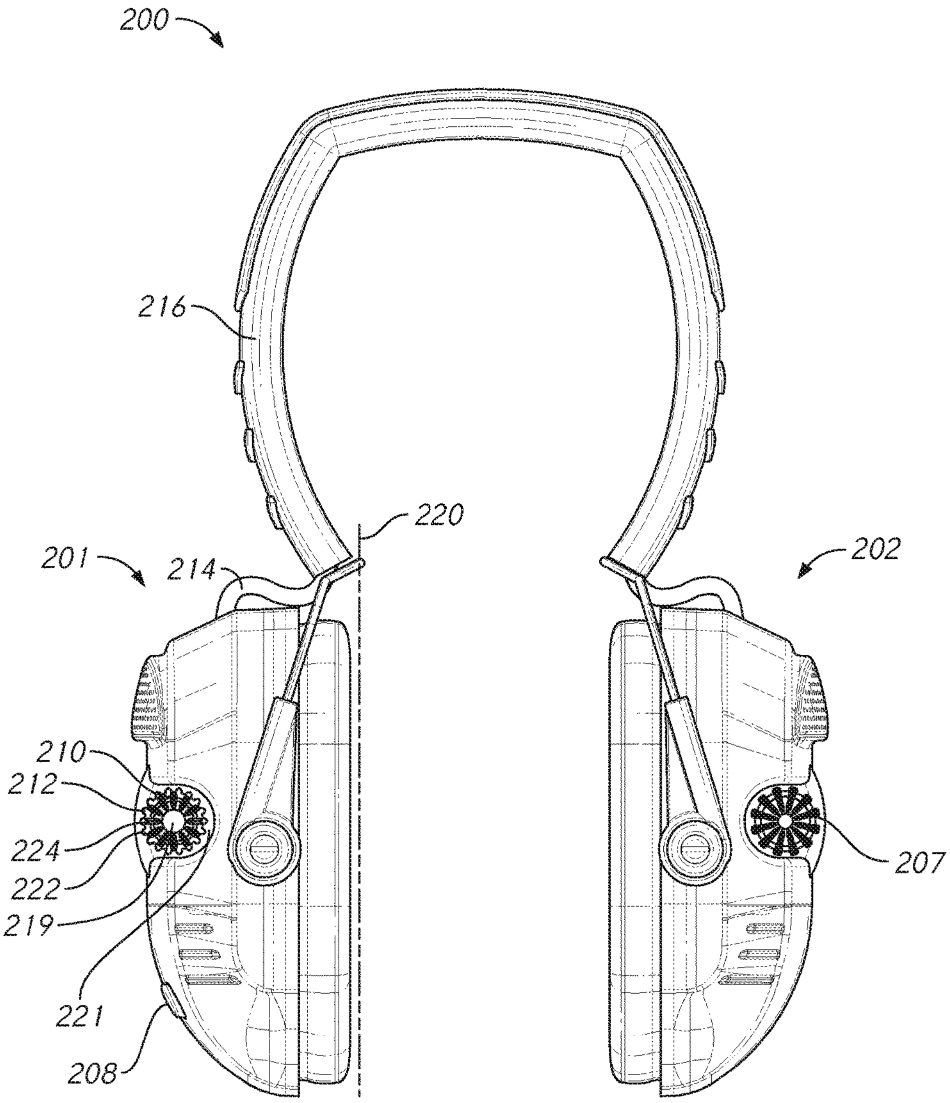
FIG. 2C is a front plan view of the multi-source audio amplification and ear protection device of FIG. 2A.

FIGS. 2A-2C illustrated various views of another embodiment of a multi-source audio amplification and ear protection device 200. The multi-source audio amplification and ear protection device 200 includes a right ear muff or cup 201, a left ear cup 202, and a headband 216 that couples the right ear cup 201 to the left ear cup 202. The illustrated left ear cup 202 includes an audio input port 225, a left-side ambient volume control knob 207, left-side microphones 205*a* and 205*b*, and a left-side speaker 232. The illustrated right ear cup 201 includes right-side microphones 206*a* and 206*b*, a pairing button 208, a right-side ambient volume control knob 210, a secondary sound source volume control knob 212, and a right-side speaker 231.

Although FIGS. 2A-2C show one embodiment of an audio amplification and ear protection device that can provide a user with separate control of multiple audio sources, the teachings herein are applicable to a wide variety of configurations. For example, the teachings herein are applicable to audio amplification and ear protection devices implemented using a wide variety of form factors and/or including a wide range of features or functionality. Additionally, although shown as including ear cups, an audio amplification and ear protection device can include a wide range of ear piece(s), including, for example, ear plug(s), ear cup(s), ear phone(s), or a combination thereof.

The illustrated embodiment includes over-ear muff-type cups 201 and 202, which can provide a greater amount of ear protection and/or improved listening and comfort for long periods relative to the embodiment shown in FIGS. 1A-1E. For example, the cups 201 and 202 can be placed over the user's ears, thereby enclosing the user's ears and reducing the amount of ambient sound that directly reaches the user. Thus, the device 200 can be suitable for a wide range of loud environments, including, but not limited to, shooting ranges, hunting grounds, constructions sites, DJ booths (for instance, at night clubs), record sessions, training in large classrooms, entertainment shows, race events, and/or on sporting boats.

In the illustrated embodiment, the left-side ambient volume control knob 207 and the right-side ambient volume control knob 210 provide a user of the device 200 with control over the volume of ambient sound. Additionally, the secondary sound source volume control knob 212 provides a user of the device 200 with control over the volume of sound from a secondary sound source, which can be, for example, audio received over a wireless connection (for instance, a Bluetooth, Zigbee, Wi-Fi, NFMI, AirPlay, SKAA, 2.4 GHz RF, and/or other connection), audio received over a wired connection (for instance, via the audio input port 225), and/or audio received from a built-in audio component, such as a music player, an integrated radio (for instance, AM, FM and/or XM radio), integrated phone and/or audio playback device.

In the illustrated embodiment, the left-side ambient volume control knob 207 can be rotated to control volume of ambient sounds captured by the left-side microphones 205*a* and 205*b*, and the right-side ambient volume control knob 210 can be rotated to control volume of ambient sounds captured by the right-side microphones 206*a* and 206*b*. Accordingly, the volume of ambient sounds can be separately controlled to the left and right ears, in this embodiment. The secondary sound source volume control knob 212 allows for adjustment of the volume level output to the speakers 231 and 232 of sounds from the secondary sound source.

Although the illustrated embodiment uses knob interfaces implemented on the device 200, the teachings herein are applicable to devices controlled in a wide variety of ways. For example, an ambient sound control interface and/or a secondary sound source control interface can use a different style of interface and/or can be located in other positions. Additionally, the teachings herein are applicable to devices that are remotely controlled, including but not limited, devices controlled using a dedicated remote control (wireless and/or wired, such as pluggable) and/or by using a tablet, phone, smart watch, laptop, computer, and/or other control device. Moreover, the teachings herein are applicable to devices that operate using voice-activated control. Furthermore, the teachings herein are applicable to devices that can be controlled in multiple ways, such by a combination of on-device interface(s), remote control device(s), and voice-activated control, thereby providing the user with flexibility in controlling the device in a manner that is desirable for a particular application.

In the illustrated embodiment, the secondary sound source volume control knob 212 and the right-side ambient volume control knob 210 are cylindrical and have the same center axis 219, but have different widths. For example, the knobs 210 and 212 are of differing diameters, and are positioned in a recessed cavity 221 of the right ear cup 201. The knobs 210 and 212 are positioned coaxially, and the longitudinal axis 219 of both knobs 210 and 212 is substantially parallel to a plane 220 (see FIG. 2C) defined by the side of the right ear cup 201, in this example. By placing the knobs 210 and 212 inside recess 221, the chance of inadvertently adjusting and/or damaging the control knob is reduced. Additionally, the knob 212 includes ribbed flanges 222, and the knob 210 includes ribbed flanges 224. The ribbed flanges 222 and 224 are distributed around the circumference of each knob and extend along the length the knobs, thereby facilitating gripping and turning of the knobs 210, 212.

The audio amplification and ear protection device 200 uses one example of touch differentiated controls, which can provide a number of advantages. For example, including one or more flanges or other protrusions or gripping features on the knobs facilitates turning of the knobs, which is particularly useful when the majority of knobs is enclosed with recess 221 and thus inaccessible to the user for gripping. Furthermore, the illustrated arrangement with coaxial knobs 210 and 212 of differing diameters allows the user to tactilely distinguish the two knobs from one another, and also to adjust both knobs in one motion. Although one example of touch differentiated controls is shown, other implementations are possible.

The illustrated audio amplification and ear protection device 200 includes two ear cups 201 and 202, one that goes over each ear of the user. The two ear cups 201 and 202 can separately detect external, ambient noise from outside and separately transmit (or cancel) the noise to the respective ear. In the illustrated embodiment, each of the cups 201 and 202 includes two microphones. However, other implementations are possible, including, for example, configurations with more or fewer microphones. Thus, the cup 201 and/or the cup 202 can include more or fewer microphones. For example, one or more microphones can be included and positioned to capture the user's voice, such as when the user is providing a voice command and/or using the device 200 to make a call.

Including multiple microphones on the device 200 can aid in capturing sounds at a wide variety of angles, including, for instance, 360 degrees around a user. Thus, while the microphones can be used to detect the same sounds, each microphone can face a different direction and provide a more accurate detection of the noise. For example, the microphones closer to the front of the user can detect noise coming from the front, and the microphones closer to the back of the user can detect the noise coming from the back. Similarly, the microphones closer to the right of the user can detect noise coming from the right, and the microphones closer to the left of the user can detect the noise coming from the left. The sounds can be reproduced to the speaker(s) of each ear cup 201 and 202 such that the user can better discriminate which direction sounds are coming from. For instance, if a turkey gobbles to the right of the user, the right-side speaker 231 would reproduce the sound at a higher volume level relative to the left-side speaker 232. Although the illustrated embodiment includes one speaker in each ear cup 201 and 202, other implementations are possible. In one example, separate speakers are provided for sound captured from each microphone of the device. Thus, if a sound is generated behind and to the right of the user, a corresponding speaker would play the sound the loudest.

In another example, a DJ uses the device 200 to both hear a song currently playing and an upcoming song in real-time. The song currently playing is captured from the ambient environment vias the device's microphones, and the upcoming song is provided from a secondary sound source (including, but not limited to a Bluetooth connection). The relative volume of the song currently playing can be controlled relative to the volume of the upcoming song, thereby aiding the DJ in providing enhanced beat matching. Additionally, in certain implementations, the sound captured from one direction (for instance, to the right of the DJ) can be separately controlled relative to sound captured from another direction (for instance, to the left of the DJ). Thus, a monitor speaker can be placed on either side of the DJ booth, and the DJ can provide separate sound adjustment to match the volume of the currently playing song in both ears.

The audio amplification and ear protection device 200 simultaneously processes both sounds from an ambient sound source and sounds from a secondary sound source, and allows the user to separately control the volume of the sounds. In one embodiment, the secondary sound source is provided from a wireless connection, such as a Bluetooth connection. Other implementations, however, are possible.

Thus, the device 200 can be paired to another device, such as a smartphone, a tablet, a computer, and/or any other suitable electronic device. The paired device (e.g., a cell phone) can transmit audio signals such as music, dialog, or electronic notifications, which can be played in the speakers of the ear cups. The pairing can be activated for a device when the user presses a pairing button 208. The pairing can be performed in a variety of ways, including but not limited to, using the pairing button 208 and/or via automatic pairing. In the illustrated embodiment, sounds from the secondary sound source can be played in the same speakers 231 and 232 as ambient sounds detected by the device's microphones. However, other implementations are possible, such as configuration in which separate speakers are included for outputting the audio received from the secondary sound source.

Thus, the device 200 can be configured to establish a two-way audio communication with a paired device such that a user can talk on the phone via the Bluetooth or other wireless connection, for example.

The audio amplification and ear protection device 200 includes an electrical system housed therein. In one implementation, each of the ear cups 201 and 202 includes electronic circuitry for processing sounds detected from the microphones of the cup and for driving the speaker of the cup. Electronics used for processing sounds from a secondary sound source can be implemented in a wide variety of ways, including, for example, in one or both of the cups. In the illustrated embodiment, the right ear cup 201 is electrically connected to the left ear cup 202 via a wire 214, which is partially concealed in the headband 216 in this example. In another embodiment, the right ear cup 201 and the second ear cup 202 each include a transceiver and communicate to one another wirelessly. In yet another embodiment, the right ear cup 201 and the left ear cup 202 communicate using a combination of wired and wireless signaling.

Additional details of the multi-source audio amplification and ear protection device 200 can be as described herein.

Figure 3:
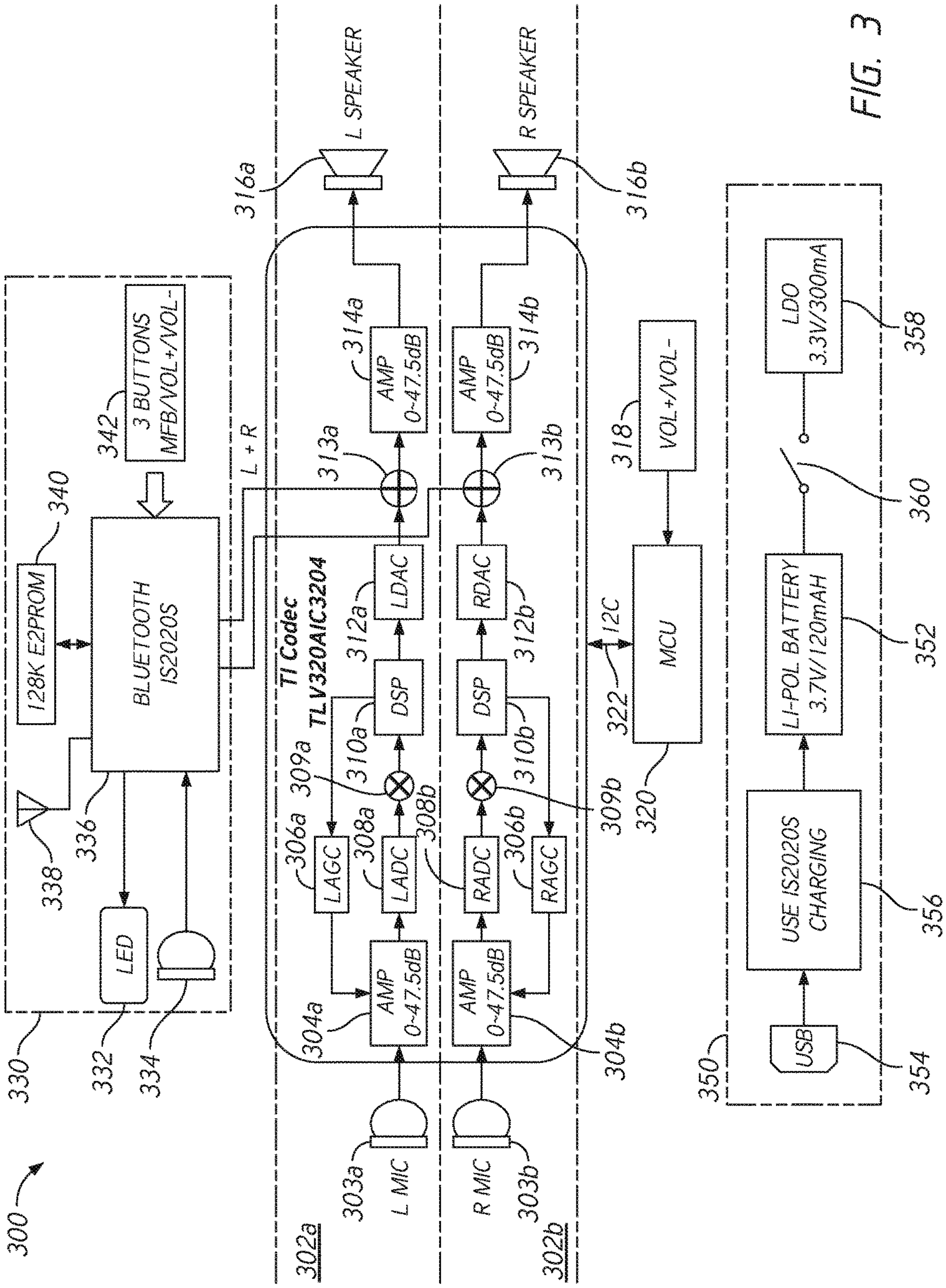
FIG. 3 is a schematic diagram of one embodiment of an electrical system of a multi-source audio amplification and ear protection device.

FIG. 3 is a schematic diagram of one embodiment of an electrical system 300 of a multi-source audio amplification and ear protection device. The illustrated electrical system 300 includes a left audio channel 302*a*, a right audio channel 302*b*, a microcontroller 320, Bluetooth circuitry 330, and power management circuitry 350.

Although one example of an electrical system is shown, multi-source audio amplification and ear protection devices can be implemented in a wide variety of ways. Accordingly, the teachings herein are applicable to electrical systems implemented in a wide variety of ways, including but not limited to, implementations that are based on a device's features, functionality, desired control interface(s), number of speakers, number of microphones, and/or form factor.

The illustrated left audio channel 302*a* includes a left channel ambient microphone 303*a*, a left channel variable gain preamplifier 304*a*, a left channel analog-to-digital converter (ADC) 308*a*, a left channel digital mixer 309*a*, a left channel digital signal processor (DSP) 310*a*, a left channel automatic gain controller 306*a*, a left channel digital-to-analog converter (DAC) 312*a*, a left channel summer 313*a*, a left channel speaker amplifier 314*a*, and a left channel speaker 316*a*. Additionally, the illustrated right audio channel 302*b* includes a right channel ambient microphone 303*b*, a right channel variable gain preamplifier 304*b*, a right channel ADC 308*b*, a right channel digital mixer 309*b*, a right channel DSP 310*b*, a right channel automatic gain controller 306*b*, a right channel DAC 312*b*, a right channel summer 313*b*, a right channel speaker amplifier 314*b*, and a right channel speaker 316*b*.

The illustrated Bluetooth circuitry 330 includes a light emitting diode (LED) 332, a Bluetooth microphone 334, a Bluetooth controller 336, an antenna 338, a programmable memory 340, and a Bluetooth interface 342, which serves as a secondary sound source control interface, in this example. The illustrated power management circuitry 350 includes a USB interface 354, a battery charging circuit 356, a lithium polymer battery 352, a low dropout (LDO) regulator 358, and a switch 360. The illustrated microcontroller 320 is coupled to an ambient sound control interface 318.

In the illustrated embodiment, the left channel ambient microphone 303*a* generates a first ambient sound signal based on detecting ambient sound, and provides the first ambient sound signal to the electrical system 300 for amplification and processing. Additionally, the right channel ambient microphone 303*b* generates a second ambient sound signal based on detecting ambient sound, and provides the second ambient sound signal to the electrical system 300 for amplification and processing. The microphone 334 generates a third ambient sound signal based on detecting ambient sound, and provides the third ambient sound signal to the electrical system 300 for amplification and processing. The electrical system 300 also receives a secondary sound source signal, which comes from the antenna 338 in this embodiment. However, a secondary sound source signal can be received in other ways. In the illustrated embodiment, the electrical system 300 controls volume of ambient sound based on a first user-controlled volume signal received from the interface 318 and controls volume of sound from a secondary sound source based on a second user-controlled volume signal received from the interface 342.

The illustrated electrical system 300 can be housed in multi-source audio amplification and ear protection device, such as the multi-source audio amplification and ear protection device 100 of FIGS. 1A-1E and/or the multi-source audio amplification and ear protection device 200 of FIGS. 2A-2C. For instance, with reference to FIGS. 1A-1E and 3, the microphones 303*a* and 303*b* can correspond to the microphones 102*a* and 102*b*, the speakers 316*a*, 316*b* can correspond to the speakers 114*b* and 114*a*, the microphone 334 can correspond to the microphone 135, the interface 342 can correspond to the interface 122, and the interface 318 can correspond to the interface 121. Although the electrical system 300 illustrates one example of an electrical system for a multi-source audio amplification and ear protection device, the multi-source audio amplification and ear protection devices described herein can be implemented using a wide range of electrical systems.

The microcontroller 320 processes volume control signals received from the ambient sound control interface 318, and provides processed ambient volume control signals to the left and right audio channels 302*a* and 302*b* via a serial interface 322 in this example. The processed ambient volume control can be provided to, for instance, the left and right channel DSPs 310*a* and 310*b*.

The Bluetooth controller 336 detects sounds (for instance, a user speaking) via the Bluetooth microphone 334, and communicates with a paired device via the Bluetooth antenna 338. The illustrated example includes an LED 332 for indicating when a Bluetooth connection is active. The Bluetooth controller 336 also receives Bluetooth volume control signals from the Bluetooth sound control interface 342. The Bluetooth controller 336 processes Bluetooth signals received via the antenna 338 based on the Bluetooth volume control signals to generate a left channel Bluetooth signal and a right channel Bluetooth signal. As shown in FIG. 3, the left channel Bluetooth signal is added to the left audio channel 302*a* via the left channel summer 313*a*, and the right channel Bluetooth signal is added to the right audio channel 302*b* via the right channel summer 313*b*.

Accordingly, the left and right channel speakers 316*a* and 316*b* output sounds from both the secondary sound source (Bluetooth in this example) and the ambient sound source (captured via microphones 303*a* and 303*b*). Additionally, the Bluetooth sound control interface 342 and the ambient sound control interface 318 can be used to control volume of Bluetooth sounds separately from volume of ambient sounds.

The illustrated left and right audio channels 302*a* and 302*b* are implemented with automatic gain control. For example, when the left DSP 310*a* detects loud sounds via the left channel ambient microphone 303*a*, the left channel automatic gain controller 306*a* can reduce the gain of the left channel variable gain preamplifier 304*a*, thereby reducing the ambient sound volume heard by the user from the left channel. Similarly, when the right DSP 310*b* detects loud sounds via the right channel ambient microphone 303*b*, the right channel automatic gain controller 306*b* can reduce the gain of the right channel variable gain preamplifier 304*b*.

Thus, the illustrated electrical system 300 illustrates one example of an electrical system implemented with an audio compression function to protect a user's ears from damage from loud sounds. For instance, the electrical system 300 can be configured to determine when sounds detected by the microphones are above a threshold sound level (e.g., 65 dB, 70 dB, 80 dB, 85 dB, 90 dB, 100 dB, 110 dB, 120 dB, or higher), and drive the speakers in the corresponding ear pieces to a safe output level.

At the same time, the left and right audio channels 302*a* and 302*b* can provide adjustable volume output of sounds below the safety threshold that are detected by the left and right ambient microphones 303*a* and 303*b*, and provide corresponding sounds in the right and left speakers 316*a* and 316*b*, respectively. The sounds detected by the microphones 303*a* and 303*b* are outputted to the left and right speakers 316*a* and 316*b* based on the current volume control settings by the ambient sound control interface 318. Additionally, the Bluetooth sound control interface 342 separately controls the volume of Bluetooth sounds from the Bluetooth circuitry 330.

Figure 4:
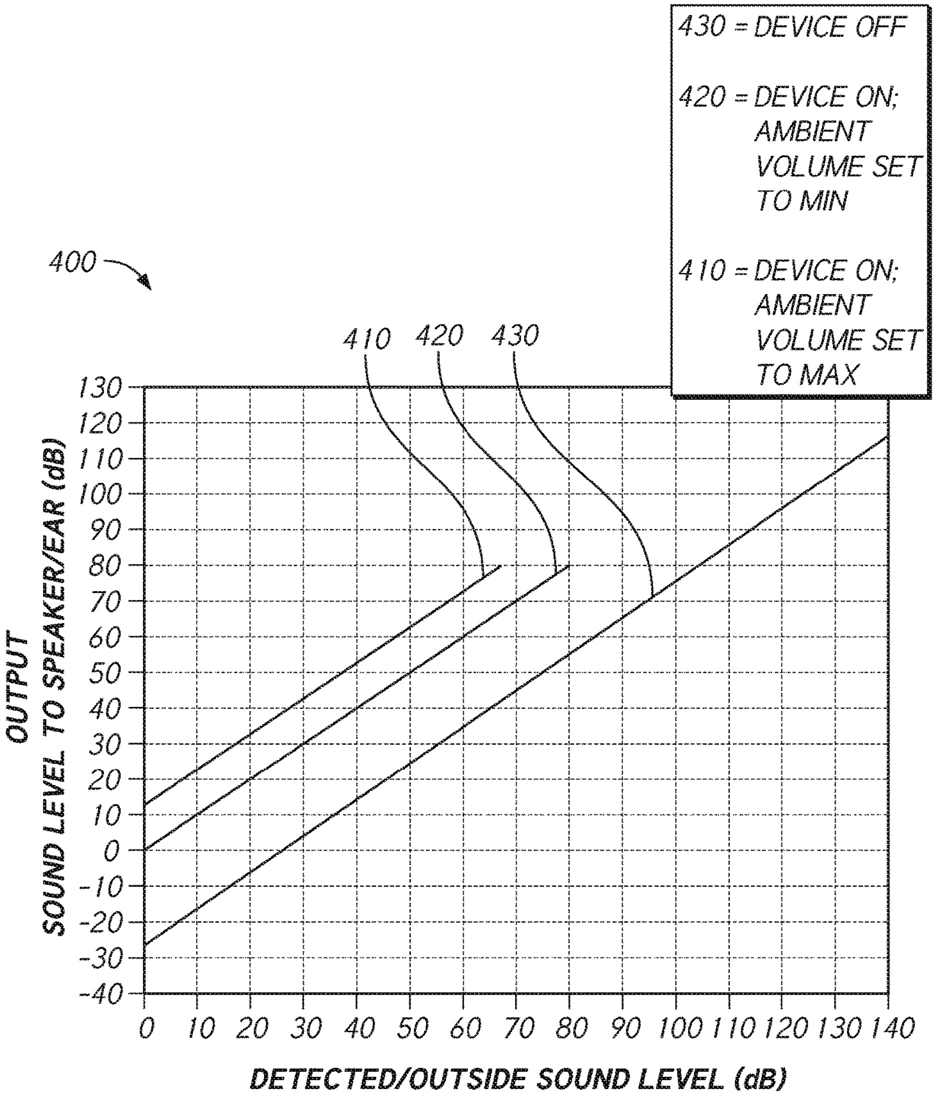
FIG. 4 shows one example of a gain/compression curve for a multi-source audio amplification and ear protection device.

FIG. 4 shows one example of a gain/compression curve 400 for a multi-source audio amplification and ear protection device. FIG. 4 includes a first plot 410 of detected ambient sound versus sound to ear with the device on with ambient volume set to maximum, a second plot 420 of detected ambient sound versus sound to ear with the device on with ambient volume set to minimum, and a third plot 430 of detected ambient sound versus sound to ear with the device off. In certain implementations, when the device has independent ambient volume control for each ear, the illustrated gain/compression curves can be similar for each ear.

Although one example gain/compression curve is shown, the teachings herein are applicable to a wide variety of gain/compression characteristics. For example, other implementations of volume control are possible, including, for example, different implementations of minimum and/or maximum volume. For instance, in other implementations, when the device is on with ambient volume set to minimum, a device can provide attenuation to ambient sound or mute ambient sound, thereby helping a user to reduce or eliminate the hearing of ambient sound in noisy environments, such as at construction sites, on boats, and/or at shooting ranges.

Figure 5:
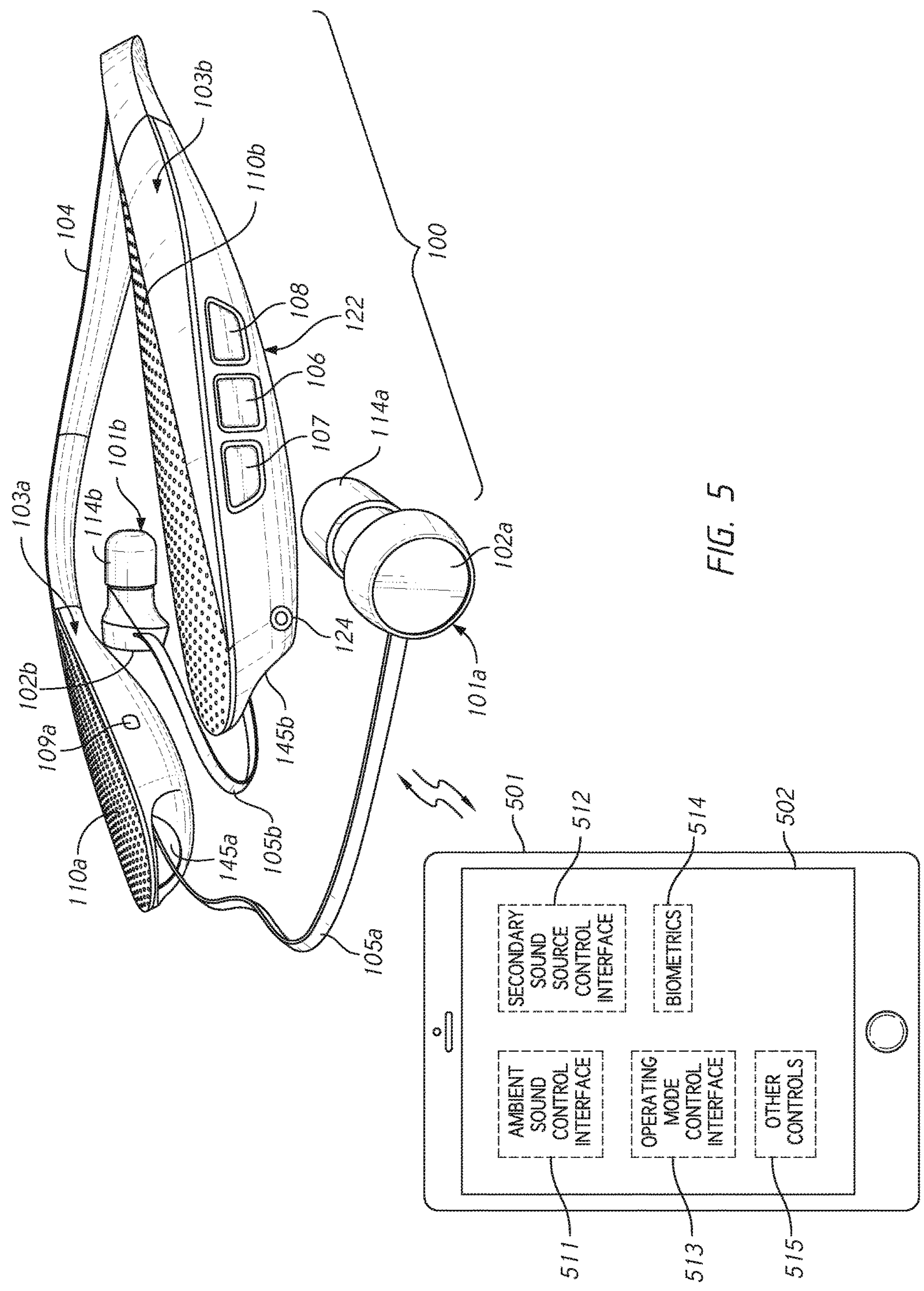
FIG. 5 is a perspective view of a remote device controlling a multi-source audio amplification and ear protection device according to one embodiment.

FIG. 5 is a perspective view of a remote device 501 controlling a multi-source audio amplification and ear protection device 100 according to one embodiment. Although specific embodiments of a remote device and of a multi-source audio amplification and ear protection device are shown, the remote device and/or multi-source audio amplification and ear protection device can be implemented in a wide variety of ways.

As shown in FIG. 5, the remote device 501 includes a touch screen display 502, which includes an ambient sound control interface 511, a secondary sound control interface 512, an operating mode control interface 513, biometrics 514, and other controls 515. In the illustrated embodiment, the remote device 501 and the multi-source audio amplification and ear protection device 100 wirelessly communicate with one another. In one example, the remote device 501 and the multi-source audio amplification and ear protection device 100 are paired over a Bluetooth connection. However, other implementations are possible.

The ambient sound control interface 511 can be used to control a volume of ambient sound played by the device 100. Additionally, the secondary sound control interface 512 can be used to separately control a volume of sound from a secondary sound source play by the device 100.

The operating mode control interface 513 can be used to control an operating mode of the device 100. In one example, the multi-source audio amplification and ear protection device 100 can be operable in a selected mode chosen from multiple user-selectable operating modes or profiles. Additionally, the different user-selectable operating modes can provide different amounts of amplification to sounds of different frequencies and/or provide other mode-dependent processing. For instance, the user-selectable multiple operating modes can include, but are not limited to, one or more of an indoor human voice mode, an outdoor human voice mode, a hunting mode, an indoor shooting mode, an outdoor shooting mode, a bird watching mode, a car mode, a bus mode, a train mode, an aircraft mode, a restaurant mode, a construction site mode, a sporting boat mode, a classroom mode, an audio guide mode, a media assisted listening mode, a loud concert mode, and/or a headphones mode. Each operating mode can provide amplification, equalization, and/or other audio processing suitable for a particular application or operating environment associated with the mode. The sound volume after such processing can be further scaled by the user via volume control, including separate volume control for both an ambient sound source and a secondary sound source via the interfaces 511 and 512.

The biometrics 514 can include displayed data related to biometrics captured by the device 100, including but not limited to, a user's footsteps, amount of perspiration, heart rate, blood pressure, and/or skin temperature. Including the biometrics 514 allows the user and/or authorized third-part to obtain biometric data reports. In one example, a nurse, caregiver, or other authorized person can use the remote device 501 to obtain biometric data from a patient wearing the device 100. In certain implementations, the device 100 can auto-generate a review request and/or alarm when the biometric data is abnormal.

The illustrated display 502 includes other controls 515, which can be used to control the multi-source audio amplification and ear protection device 100 in a wide variety of ways. In one example, the controls 515 can be used to remotely turn on or off the device, run diagnostics, perform software updates, and/or perform a wide variety of other functions.

Figure 6:
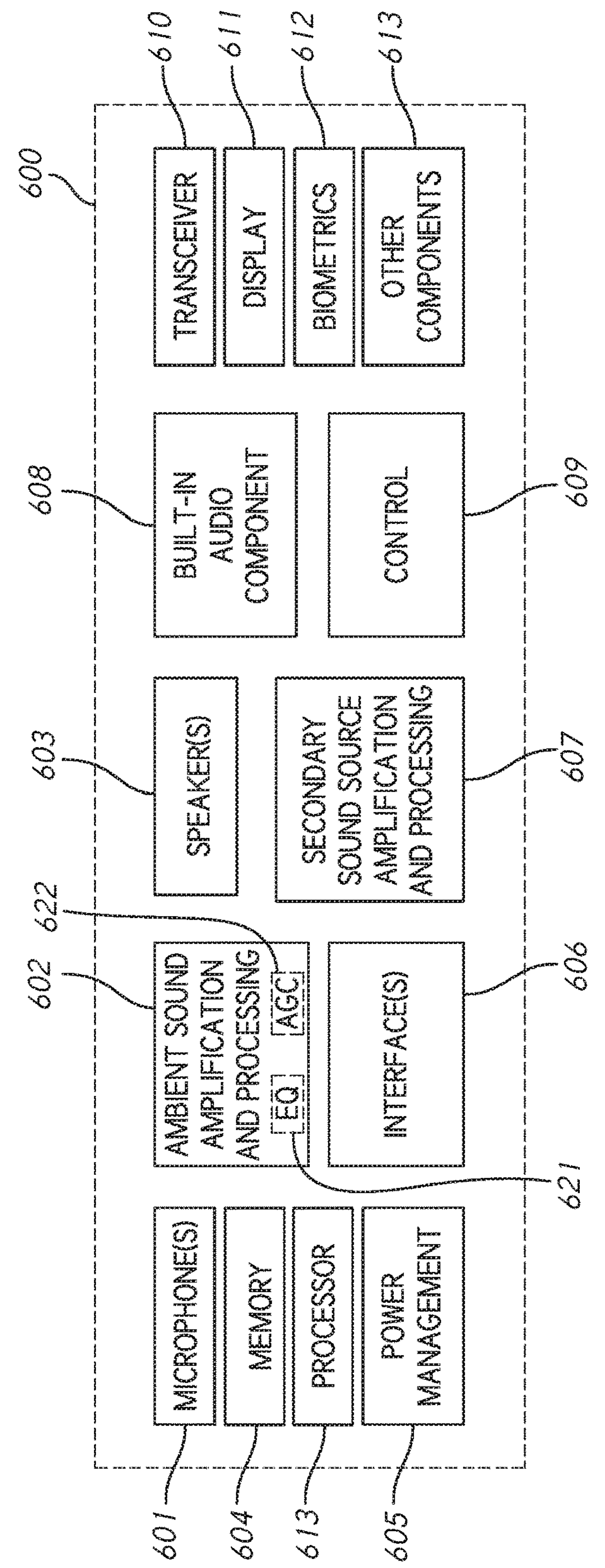
FIG. 6 is a schematic block diagram of a multi-source audio amplification and ear protection device according to one embodiment.

FIG. 6 is a schematic block diagram of a multi-source audio amplification and ear protection device 600 according to one embodiment. The multi-source audio amplification and ear protection device 600 includes microphone(s) 601, ambient sound amplification and processing circuitry 602, speaker(s) 603, memory 604, power management circuitry 605, user interface(s) 606, secondary sound source amplification and processing circuitry 607, a built-in audio component 608, control circuitry 609, a transceiver 610, a display 611, a biometrics component 612, and other components 613. As shown in FIG. 6, the ambient sound amplification and processing circuitry 602 includes frequency dependent processing circuitry 621 (equalization circuitry, in this example) and automatic gain control circuitry 622.

Although one example of components and functionality is shown in FIG. 6, a multi-source audio amplification and ear protection device can include more or fewer features. Moreover, a multi-source audio amplification and ear protection device can be implemented using a wide variety of form factors, including any of the form factors shown and described herein (e.g., with respect to FIGS. 1A-1H and 2A-2C) or another form factor.

Terminology

Conditional language, such as, among others, "can," "could," "might," or "may," unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment. Conjunctions, such as "and," "or" are used interchangeably and are intended to encompass any one element, combination, or entirety of elements to which the conjunction refers.

Depending on the embodiment, certain acts, events, or functions of any of the algorithms described herein can be performed in a different sequence, can be added, merged, or left out altogether (e.g., not all described acts or events are necessary for the practice of the algorithms). Moreover, in certain embodiments, acts or events can be performed concurrently, e.g., through multi-threaded processing, interrupt processing, or multiple processors or processor cores or on other parallel architectures, rather than sequentially.

The multi-source audio amplification and ear protection devices described herein may comprise software, firmware, hardware, or any combination(s) of software, firmware, or hardware suitable for the purposes described herein. Various disclosed and illustrated modules may be implemented as software and/or firmware on a logic circuitry, processor, microcontroller, ASIC/FPGA, or dedicated hardware. Software and other modules may reside remotely from a multi-source audio amplification and ear protection device, such as on personal computers, computerized tablets, PDAs, and other devices suitable for the purposes described herein, such as remote control of a multi-source audio amplification and ear protection device. Software and other modules may be accessible via local memory, via a network, or via other means suitable for the purposes described herein. User interface components described herein may comprise buttons, knobs, switches, touchscreen interfaces, and other suitable interfaces.

Computer program instructions may be stored in a computer-readable memory that can direct a computer or other programmable data processing apparatus to operate in a particular manner, thereby aiding in controlling a multi-source audio amplification and ear protection device.

The processing of the various components of the illustrated systems can be distributed across multiple logic circuits, processors, and other computing resources. In addition, two or more components of a system can be combined into fewer components. Various components of the illustrated systems can be implemented in one or more virtual machines, rather than in dedicated computer hardware systems. Moreover, in some embodiments the connections between the components shown represent possible paths of data flow, rather than actual connections between hardware. While some examples of possible connections are shown, any of the subset of the components shown can communicate with any other subset of components in various implementations.

While certain embodiments have been described, these embodiments have been presented by way of example only, and are not intended to limit the scope of the disclosure. Indeed, the novel methods and systems described herein may be embodied in a variety of other forms; furthermore, various omissions, substitutions and changes in the form of the described methods and systems may be made without departing from the spirit of the disclosure. The accompanying claims and their equivalents are intended to cover such forms or modifications as would fall within the scope and spirit of the disclosure.

What is claimed is:

1. An audio amplification and ear protection device comprising:

at least one microphone configured to generate an ambient sound signal based on detecting ambient sound;

at least one speaker;

an electrical system configured to amplify the ambient sound signal and a secondary sound source signal, and to control the at least one speaker to simultaneously output sound based on the ambient sound signal and sound based on the secondary sound source signal, wherein the electrical system is configured to receive a first user-controlled volume signal operable to control an amount of amplification provided to the ambient sound signal and a second user-controlled volume signal operable to control an amount of amplification provided to the secondary sound source signal, wherein the electrical system is operable in a plurality of user-selectable operating modes including a first user-selectable operating mode and a second user-selectable operating mode, wherein the electrical system provides different amounts of gain to the ambient sound signal in different frequency ranges when operating in the first user-selectable operating mode relative to the second user-selectable operating mode, wherein the electrical system comprises an automatic gain controller configured in the first and second user-selectable operating modes to implement automatic compression by limiting a maximum volume of sound outputted by the at least one speaker, the automatic gain controller configured to operate with a different threshold level for automatic compression in the first user-selectable operating mode than in the second user-selectable operating mode;

an ambient sound control interface configured to generate the first user-controlled volume signal based on a first user input to control the ambient sound signal; and a secondary sound source control interface configured to generate the second user-controlled volume signal based on a second user input to control the secondary sound source signal.

2. The audio amplification and ear protection device of claim 1, wherein the device is a hearing aid.

3. The audio amplification and ear protection device of claim 1, further comprising a transceiver configured to wirelessly receive the secondary sound source signal.

4. The audio amplification and ear protection device of claim 3, wherein the transceiver comprises a Bluetooth transceiver.

5. The audio amplification and ear protection device of claim 1, further comprising an audio input port configured to receive the secondary sound source signal via a wired connection.

6. The audio amplification and ear protection device of claim 1, further comprising a built-in audio component configured to generate the secondary sound source signal.

7. The audio amplification and ear protection device of claim 1, wherein at least one of the ambient sound control interface or the secondary sound control interface comprises a touch differentiated control.

8. The audio amplification and ear protection device of claim 7, wherein the touch differential control comprises a first knob of a first diameter, and a second knob of a second diameter greater than the first diameter.

9. The audio amplification and ear protection device of claim 1, wherein the electrical system is configured to wirelessly receive the first and second user-controlled volume signals.

10. The audio amplification and ear protection device of claim 1, wherein the at least one microphone comprises a first microphone operable to capture ambient sound from a first direction, and a second microphone configured to capture ambient sound from a second direction different from the first direction.

11. The audio amplification and ear protection device of claim 10, wherein the electrical system is configured to control sound outputted to a first speaker of the at least one speaker based on ambient sound captured by the first microphone and to separately control sound outputted to a second speaker of the at least one speaker based on ambient sound captured by the second microphone.

12. The audio amplification and ear protection device of claim 11, wherein the electrical system is configured to receive one or more user-controlled volume signals operable to separately control volume of sound outputted to the first speaker relative to volume of sound outputted to the second speaker.

13. The audio amplification and ear protection device of claim 11, further comprising a first ear piece including the first speaker and the first microphone, and a second ear piece comprising the second speaker and the second microphone.

14. The audio amplification and ear protection device of claim 13, further comprising a device body, wherein the at least one microphone further comprises a third microphone operable to capture ambient sound from a third direction different from the first direction and the second direction, wherein the third microphone is located on the device body.

15. The audio amplification and ear protection device of claim 14, wherein the electrical system comprises a transceiver configured to wirelessly receive the secondary sound source signal and to wirelessly transmit ambient sound detected by the third microphone.

16. The audio amplification and ear protection device of claim 15, wherein the device body comprises a first arm, a second arm, and a neck loop connecting the first and second arms, wherein the third microphone is integrated within a perforated acoustic grating of the first arm or the second arm.

17. The audio amplification and ear protection device of claim 13, wherein the first ear piece comprises a first ear plug configured for insertion in a first ear of a user, and wherein the second ear piece comprises a second ear plug configured for insertion in a second ear of a user.

18. The audio amplification and ear protection device of claim 13, wherein the first ear piece comprises a first ear cup configured to enclose a first ear of a user, and wherein the second ear piece comprises a second ear cup configured to enclose a second ear of a user.

19. The audio amplification and ear protection device of claim 1, wherein the electrical system is further operable to process the secondary sound source signal differently in the first user-selectable operating mode relative to the second user-selectable operating mode.

20. The audio amplification and ear protection device of claim 19, wherein the electrical system provides frequency-dependent amplification to the secondary sound source signal in one or more of the plurality of user-selectable operating modes.

21. A method of processing sound in an audio amplification and ear protection device, the method comprising:

generating an ambient sound signal based on detecting ambient sound using at least one microphone;

using one or more speakers to simultaneously output sound based on the ambient sound signal and sound based on a secondary sound signal;

controlling an amount of amplification to the ambient sound signal provided by an electrical system based on a first user-controlled volume signal;

controlling an amount of amplification to the secondary sound source signal provided by the electrical system based on a second user-controlled volume signal;

changing a mode of operation of the electrical system from a first user-selectable operating mode to a second user-selectable operating mode;

providing different amounts of gain to the ambient sound signal in different frequency ranges in the first user-selectable operating mode of the electrical system relative to the second user-selectable operating mode of the electrical system;

limiting a maximum volume of sound outputted by the one or more speakers using automatic gain control, including operating with a different threshold level for automatic compression in the first user-selectable operating mode than in the second user-selectable operating mode;

generating the first user-controlled volume signal based on a first user input to control the ambient sound signal; and generating the second user-controlled volume signal based on a second user input to control the secondary sound source signal.

22. An apparatus comprising:

a first ear piece comprising:

a first microphone configured to generate an ambient sound signal based on detecting ambient sound, and a first speaker configured to output sound based on both the ambient sound signal and a secondary sound source signal;

electronic circuitry configured to simultaneously amplify the ambient sound signal and the secondary sound source signal, wherein the electronic circuitry is configured to receive a first user-controlled volume signal operable to control an amount of amplification provided to the ambient sound signal and a second user-controlled volume signal operable to control an amount of amplification provided to the secondary sound source signal, wherein the electronic circuitry is operable in a plurality of user-selectable operating modes including a first user-selectable operating mode and a second user-selectable operating mode, wherein the electronic circuitry provides different amounts of gain to the ambient sound signal in different frequency ranges when operating in the first user-selectable operating mode relative to the second user-selectable operating mode, wherein the electronic circuitry comprises an automatic gain controller configured in the first and second user-selectable operating modes to implement automatic compression by limiting a maximum volume of sound outputted by the first speaker, the automatic gain controller configured to operate with a different threshold level for automatic compression in the first user-selectable operating mode than in the second user-selectable operating mode;

an ambient sound control interface configured to generate the first user-controlled volume signal based on a first user input to control the ambient sound signal; and a secondary sound source control interface configured to generate the second user-controlled volume signal based on a second user input to control the secondary sound source signal.

23. The apparatus of claim 22, wherein the electronic circuitry is further operable to process the secondary sound source signal differently in the first user-selectable operating mode relative to the second user-selectable operating mode.

24. The audio amplification and ear protection device of claim 1, wherein the automatic gain controller is configured to decrease the amount of amplification provided to the ambient sound signal for a time duration after detecting an ambient sound event above a threshold level, wherein the first user-selectable operating mode and the second user-selectable operating modes provide different time durations for automatic compression.

25. The audio amplification and ear protection device of claim 1, wherein the at least one microphone comprises a first microphone configured to generated a first ambient sound signal and a second microphone configured to generate a second ambient sound signal, wherein the electrical system is configured to provide a greater amount of amplification to the first ambient sound signal relative to the second ambient sound signal in the first user-selectable operating mode.

26. The audio amplification and ear protection device of claim 25, wherein the first microphone comprises a directional microphone and the first user-selectable operating mode comprises a human voice mode.

27. The audio amplification and ear protection device of claim 1, wherein the first user-selectable operating mode is an outdoor mode and the second user-selectable operating mode is an indoor mode.

28. The audio amplification and ear protection device of claim 1, wherein the first user-selectable operating mode is tailored for a loud outdoor environment and the second user-selectable operating mode is tailored for an indoor environment.

* * * * *